(12) United States Patent
Lung et al.

(10) Patent No.: US 7,978,509 B2
(45) Date of Patent: Jul. 12, 2011

(54) PHASE CHANGE MEMORY WITH DUAL WORD LINES AND SOURCE LINES AND METHOD OF OPERATING SAME

(75) Inventors: Hsiang-Lan Lung, Elmsford, NY (US); Chung Hon Lam, Peekskill, NY (US)

(73) Assignees: Macronix International Co., Ltd., Hsinchu (TW); International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/759,479

(22) Filed: Apr. 13, 2010

(65) Prior Publication Data

US 2010/0195378 A1 Aug. 5, 2010

Related U.S. Application Data

(63) Continuation of application No. 11/833,143, filed on Aug. 2, 2007, now Pat. No. 7,729,161.

(51) Int. Cl.
*G11C 11/00* (2006.01)
(52) U.S. Cl. .................. 365/163; 365/148; 365/185.23
(58) Field of Classification Search .................. 365/46, 365/94, 100, 113, 129, 148, 163; 257/2–5, 257/296, E31.047, E27.006; 438/29, 95, 438/96, 166, 259, 365, 482, 486, 597; 977/754
See application file for complete search history.

(56) References Cited

U.S. PATENT DOCUMENTS

| | | | |
|---|---|---|---|
| 3,271,591 A | 9/1966 | Ovshinsky |
| 3,530,441 A | 9/1970 | Ovshinsky |
| 3,846,767 A | 11/1974 | Cohen |
| 4,452,592 A | 6/1984 | Tsai |
| 4,599,705 A | 7/1986 | Holmberg et al. |
| 4,719,594 A | 1/1988 | Young et al. |
| 4,769,339 A | 9/1988 | Ishii |
| 4,876,220 A | 10/1989 | Mohsen et al. |
| 4,959,812 A | 9/1990 | Momodomi et al. |
| 5,106,775 A | 4/1992 | Kaga et al. |
| 5,166,096 A | 11/1992 | Cote et al. |
| 5,166,758 A | 11/1992 | Ovshinsky et al. |

(Continued)

FOREIGN PATENT DOCUMENTS

WO 2004025659 A1 3/2004

OTHER PUBLICATIONS

"Magnetic Bit Boost," www.sciencenews.org, Dec. 18 & 25, 2004, p. 389, vol. 166.

(Continued)

*Primary Examiner* — Richard Elms
*Assistant Examiner* — Harry W Byrne
(74) *Attorney, Agent, or Firm* — Kenta Suzue; Haynes Beffell & Wolfeld LLP

(57) ABSTRACT

A phase change memory device includes a memory cell, first word line conductor and a second word line conductor, and first and second access devices responsive to the first and second word line conductors respectively. Control circuits are arranged to access the memory cell for read operations using only the first word line conductor to establish a current path from the bit line through the memory cell to a source line through the first access device, and to access the memory cell for operations to reset the memory cell using both the first and second access devices to establish a current path from the bit line through the memory cell to two source lines.

19 Claims, 10 Drawing Sheets

U.S. PATENT DOCUMENTS

| | | |
|---|---|---|
| 5,177,567 A | 1/1993 | Klersy et al. |
| 5,332,923 A | 7/1994 | Takeuchi |
| 5,391,901 A | 2/1995 | Tanabe |
| 5,515,488 A | 5/1996 | Hoppe et al. |
| 5,534,712 A | 7/1996 | Ovshinsky et al. |
| 5,550,396 A | 8/1996 | Tsutsumi |
| 5,687,112 A | 11/1997 | Ovshinsky |
| 5,688,713 A | 11/1997 | Linliu et al. |
| 5,716,883 A | 2/1998 | Tseng |
| 5,754,472 A | 5/1998 | Sim |
| 5,789,277 A | 8/1998 | Zahorik et al. |
| 5,789,758 A | 8/1998 | Reinberg |
| 5,814,527 A | 9/1998 | Wolstenholme et al. |
| 5,831,276 A | 11/1998 | Gonzalez et al. |
| 5,837,564 A | 11/1998 | Sandhu et al. |
| 5,841,150 A | 11/1998 | Gonzalez et al. |
| 5,869,843 A | 2/1999 | Harshfield |
| 5,879,955 A | 3/1999 | Gonzalez et al. |
| 5,902,704 A | 5/1999 | Schoenborn et al. |
| 5,920,788 A | 7/1999 | Reinberg |
| 5,933,365 A | 8/1999 | Klersy et al. |
| 5,952,671 A | 9/1999 | Reinberg et al. |
| 5,958,358 A | 9/1999 | Tenne et al. |
| 5,970,336 A | 10/1999 | Wolstenholme et al. |
| 5,985,698 A | 11/1999 | Gonzalez et al. |
| 5,998,244 A | 12/1999 | Wolstenholme et al. |
| 6,011,725 A | 1/2000 | Eitan |
| 6,025,220 A | 2/2000 | Sandhu |
| 6,031,287 A | 2/2000 | Harshfield |
| 6,034,882 A | 3/2000 | Johnson et al. |
| 6,046,951 A | 4/2000 | El Hajji |
| 6,066,870 A | 5/2000 | Siek |
| 6,075,719 A | 6/2000 | Lowrey et al. |
| 6,077,674 A | 6/2000 | Schleifer et al. |
| 6,077,729 A | 6/2000 | Harshfield |
| 6,087,269 A | 7/2000 | Williams |
| 6,087,674 A | 7/2000 | Ovshinsky et al. |
| 6,104,038 A | 8/2000 | Gonzalez et al. |
| 6,111,264 A | 8/2000 | Wolstenholme et al. |
| 6,114,713 A | 9/2000 | Zahorik |
| 6,117,720 A | 9/2000 | Harshfield |
| 6,147,395 A | 11/2000 | Gilgen |
| 6,150,253 A | 11/2000 | Doan et al. |
| 6,153,890 A | 11/2000 | Wolstenholme et al. |
| 6,177,317 B1 | 1/2001 | Huang et al. |
| 6,185,122 B1 | 2/2001 | Johnson et al. |
| 6,189,582 B1 | 2/2001 | Reinberg et al. |
| 6,236,059 B1 | 5/2001 | Wolstenholme et al. |
| RE37,259 E | 7/2001 | Ovshinsky |
| 6,271,090 B1 | 8/2001 | Huang et al. |
| 6,280,684 B1 | 8/2001 | Yamada et al. |
| 6,287,887 B1 | 9/2001 | Gilgen |
| 6,291,137 B1 | 9/2001 | Lyons et al. |
| 6,314,014 B1 | 11/2001 | Lowrey et al. |
| 6,316,348 B1 | 11/2001 | Fu et al. |
| 6,320,786 B1 | 11/2001 | Chang et al. |
| 6,326,307 B1 | 12/2001 | Lindley et al. |
| 6,337,266 B1 | 1/2002 | Zahorik |
| 6,339,544 B1 | 1/2002 | Chiang et al. |
| 6,351,406 B1 | 2/2002 | Johnson et al. |
| 6,372,651 B1 | 4/2002 | Yang et al. |
| 6,380,068 B2 | 4/2002 | Jeng et al. |
| 6,420,215 B1 | 7/2002 | Knall et al. |
| 6,420,216 B1 | 7/2002 | Clevenger et al. |
| 6,420,725 B1 | 7/2002 | Harshfield |
| 6,423,621 B2 | 7/2002 | Doan et al. |
| 6,429,064 B1 | 8/2002 | Wicker |
| 6,440,837 B1 | 8/2002 | Harshfield |
| 6,462,353 B1 | 10/2002 | Gilgen |
| 6,483,736 B2 | 11/2002 | Johnson et al. |
| 6,487,106 B1 | 11/2002 | Kozicki |
| 6,487,114 B2 | 11/2002 | Jong et al. |
| 6,501,111 B1 | 12/2002 | Lowrey |
| 6,511,867 B2 | 1/2003 | Lowrey et al. |
| 6,512,241 B1 | 1/2003 | Lai |
| 6,512,263 B1 | 1/2003 | Yuan et al. |
| 6,514,788 B2 | 2/2003 | Quinn |
| 6,514,820 B2 | 2/2003 | Ahn et al. |
| 6,534,781 B2 | 3/2003 | Dennison |
| 6,545,903 B1 | 4/2003 | Wu |
| 6,551,866 B1 | 4/2003 | Maeda |
| 6,555,860 B2 | 4/2003 | Lowrey et al. |
| 6,563,156 B2 | 5/2003 | Harshfield |
| 6,566,700 B2 | 5/2003 | Xu |
| 6,567,293 B1 | 5/2003 | Lowrey et al. |
| 6,576,546 B2 | 6/2003 | Gilbert et al. |
| 6,579,760 B1 | 6/2003 | Lung |
| 6,586,761 B2 | 7/2003 | Lowrey |
| 6,589,714 B2 | 7/2003 | Maimon et al. |
| 6,593,176 B2 | 7/2003 | Dennison |
| 6,596,589 B2 | 7/2003 | Tseng |
| 6,597,009 B2 | 7/2003 | Wicker |
| 6,605,527 B2 | 8/2003 | Dennison et al. |
| 6,605,821 B1 | 8/2003 | Lee et al. |
| 6,607,974 B2 | 8/2003 | Harshfield |
| 6,613,604 B2 | 9/2003 | Maimon et al. |
| 6,617,192 B1 | 9/2003 | Lowrey et al. |
| 6,621,095 B2 | 9/2003 | Chiang et al. |
| 6,627,530 B2 | 9/2003 | Li et al. |
| 6,639,849 B2 | 10/2003 | Takahashi et al. |
| 6,673,700 B2 | 1/2004 | Dennison et al. |
| 6,674,115 B2 | 1/2004 | Hudgens et al. |
| 6,687,307 B1 | 2/2004 | Anikhindi et al. |
| 6,744,088 B1 | 6/2004 | Dennison |
| 6,750,079 B2 | 6/2004 | Lowrey et al. |
| 6,750,101 B2 | 6/2004 | Lung |
| 6,791,102 B2 | 9/2004 | Johnson et al. |
| 6,797,979 B2 | 9/2004 | Chiang et al. |
| 6,800,504 B2 | 10/2004 | Li et al. |
| 6,800,563 B2 | 10/2004 | Xu |
| 6,815,704 B1 | 11/2004 | Chen |
| 6,838,692 B1 | 1/2005 | Lung |
| 6,850,432 B2 | 2/2005 | Lu et al. |
| 6,859,389 B2 | 2/2005 | Idehara |
| 6,861,267 B2 | 3/2005 | Xu et al. |
| 6,864,500 B2 | 3/2005 | Gilton |
| 6,864,503 B2 | 3/2005 | Lung |
| 6,867,638 B2 | 3/2005 | Saiki et al. |
| 6,881,603 B2 | 4/2005 | Lai |
| 6,888,750 B2 | 5/2005 | Walker et al. |
| 6,894,304 B2 | 5/2005 | Moore |
| 6,894,305 B2 | 5/2005 | Yi et al. |
| 6,900,517 B2 | 5/2005 | Tanaka et al. |
| 6,903,362 B2 | 6/2005 | Wyeth et al. |
| 6,909,107 B2 | 6/2005 | Rodgers et al. |
| 6,910,907 B2 | 6/2005 | Layadi et al. |
| 6,927,410 B2 | 8/2005 | Chen |
| 6,928,022 B2 | 8/2005 | Cho et al. |
| 6,933,516 B2 | 8/2005 | Xu |
| 6,936,544 B2 | 8/2005 | Huang et al. |
| 6,936,840 B2 | 8/2005 | Sun et al. |
| 6,937,507 B2 | 8/2005 | Chen |
| 6,943,365 B2 | 9/2005 | Lowrey et al. |
| 6,969,866 B1 | 11/2005 | Lowrey et al. |
| 6,972,428 B2 | 12/2005 | Maimon |
| 6,972,430 B2 | 12/2005 | Casagrande et al. |
| 6,977,181 B1 | 12/2005 | Raberg |
| 6,992,932 B2 | 1/2006 | Cohen |
| 6,998,289 B2 | 2/2006 | Hudgens et al. |
| 7,023,008 B1 | 4/2006 | Happ |
| 7,023,009 B2 | 4/2006 | Kostylev et al. |
| 7,033,856 B2 | 4/2006 | Lung |
| 7,038,230 B2 | 5/2006 | Chen et al. |
| 7,038,938 B2 | 5/2006 | Kang |
| 7,042,001 B2 | 5/2006 | Kim et al. |
| 7,054,183 B2 | 5/2006 | Rinerson et al. |
| 7,067,837 B2 | 6/2006 | Hwang et al. |
| 7,067,864 B2 | 6/2006 | Nishida et al. |
| 7,067,865 B2 | 6/2006 | Lung |
| 7,078,273 B2 | 7/2006 | Matsuoka et al. |
| 7,099,180 B1 | 8/2006 | Dodge et al. |
| 7,115,927 B2 | 10/2006 | Hideki et al. |
| 7,122,281 B2 | 10/2006 | Pierrat |
| 7,122,824 B2 | 10/2006 | Khouri et al. |
| 7,126,149 B2 | 10/2006 | Iwasaki et al. |
| 7,126,847 B2 | 10/2006 | Ha et al. |
| 7,132,675 B2 | 11/2006 | Gilton |

| | | | | | | |
|---|---|---|---|---|---|---|
| 7,151,273 B2 | 12/2006 | Campbell et al. | | 2005/0062087 A1 | 3/2005 | Chen et al. |
| 7,154,774 B2 | 12/2006 | Bedeschi et al. | | 2005/0093022 A1 | 5/2005 | Lung |
| 7,158,411 B2 | 1/2007 | Yeh et al. | | 2005/0122757 A1* | 6/2005 | Moore et al. .................. 365/63 |
| 7,164,147 B2 | 1/2007 | Lee et al. | | 2005/0127349 A1 | 6/2005 | Horak et al. |
| 7,166,533 B2 | 1/2007 | Happ | | 2005/0141261 A1 | 6/2005 | Ahn |
| 7,169,635 B2 | 1/2007 | Kozicki | | 2005/0145984 A1 | 7/2005 | Chen et al. |
| 7,202,493 B2 | 4/2007 | Lung | | 2005/0167656 A1 | 8/2005 | Sun et al. |
| 7,208,751 B2 | 4/2007 | Ooishi | | 2005/0191804 A1 | 9/2005 | Lai et al. |
| 7,214,958 B2 | 5/2007 | Happ | | 2005/0195633 A1 | 9/2005 | Choi et al. |
| 7,220,983 B2 | 5/2007 | Lung | | 2005/0201182 A1 | 9/2005 | Osada et al. |
| 7,229,883 B2 | 6/2007 | Wang et al. | | 2005/0212024 A1 | 9/2005 | Happ |
| 7,238,959 B2 | 7/2007 | Chen | | 2005/0212026 A1 | 9/2005 | Chung et al. |
| 7,238,994 B2 | 7/2007 | Chen et al. | | 2005/0215009 A1 | 9/2005 | Cho |
| 7,248,494 B2 | 7/2007 | Oh et al. | | 2005/0263829 A1 | 12/2005 | Song et al. |
| 7,251,157 B2 | 7/2007 | Osada et al. | | 2005/0270832 A1 | 12/2005 | Chu et al. |
| 7,253,429 B2 | 8/2007 | Klersy et al. | | 2006/0006472 A1 | 1/2006 | Jiang |
| 7,254,059 B2 | 8/2007 | Li et al. | | 2006/0018156 A1 | 1/2006 | Happ |
| 7,262,502 B2 | 8/2007 | Chang | | 2006/0038221 A1 | 2/2006 | Lee et al. |
| 7,269,052 B2 | 9/2007 | Segal et al. | | 2006/0066156 A1 | 3/2006 | Dong et al. |
| 7,277,317 B2 | 10/2007 | Le Phan | | 2006/0073642 A1 | 4/2006 | Yeh et al. |
| 7,291,556 B2 | 11/2007 | Choi et al. | | 2006/0091476 A1 | 5/2006 | Pinnow et al. |
| 7,309,630 B2 | 12/2007 | Fan et al. | | 2006/0094154 A1 | 5/2006 | Lung |
| 7,314,776 B2 | 1/2008 | Johnson et al. | | 2006/0108667 A1 | 5/2006 | Lung |
| 7,317,201 B2 | 1/2008 | Gutsche et al. | | 2006/0110878 A1 | 5/2006 | Lung et al. |
| 7,321,130 B2 | 1/2008 | Lung et al. | | 2006/0110888 A1 | 5/2006 | Cho et al. |
| 7,323,708 B2 | 1/2008 | Lee et al. | | 2006/0113520 A1 | 6/2006 | Yamamoto et al. |
| 7,323,734 B2 | 1/2008 | Ha et al. | | 2006/0113521 A1 | 6/2006 | Lung |
| 7,332,370 B2 | 2/2008 | Chang et al. | | 2006/0118913 A1 | 6/2006 | Yi et al. |
| 7,336,526 B2 | 2/2008 | Osada et al. | | 2006/0124916 A1 | 6/2006 | Lung |
| 7,351,648 B2 | 4/2008 | Furukawa et al. | | 2006/0126395 A1 | 6/2006 | Chen et al. |
| 7,359,231 B2 | 4/2008 | Venkataraman et al. | | 2006/0131555 A1 | 6/2006 | Liu et al. |
| 7,364,935 B2 | 4/2008 | Lung | | 2006/0138467 A1 | 6/2006 | Lung |
| 7,365,385 B2 | 4/2008 | Abbott | | 2006/0154185 A1 | 7/2006 | Ho et al. |
| 7,379,328 B2 | 5/2008 | Osada et al. | | 2006/0157680 A1 | 7/2006 | Takaura et al. |
| 7,385,235 B2 | 6/2008 | Lung | | 2006/0157681 A1 | 7/2006 | Chen et al. |
| 7,388,273 B2 | 6/2008 | Burr et al. | | 2006/0163554 A1 | 7/2006 | Lankhorst et al. |
| 7,394,088 B2 | 7/2008 | Lung | | 2006/0169968 A1 | 8/2006 | Happ |
| 7,397,060 B2 | 7/2008 | Lung | | 2006/0172067 A1 | 8/2006 | Ovshinsky et al. |
| 7,400,522 B2 | 7/2008 | Toda et al. | | 2006/0175599 A1 | 8/2006 | Happ |
| 7,423,300 B2 | 9/2008 | Lung et al. | | 2006/0186483 A1 | 8/2006 | Cho et al. |
| 7,426,134 B2 | 9/2008 | Happ et al. | | 2006/0192193 A1 | 8/2006 | Lee et al. |
| 7,427,531 B2 | 9/2008 | Cho et al. | | 2006/0198183 A1 | 9/2006 | Kawahara et al. |
| 7,440,308 B2 | 10/2008 | Jeong et al. | | 2006/0202245 A1 | 9/2006 | Zuliani et al. |
| 7,449,710 B2 | 11/2008 | Lung | | 2006/0205108 A1 | 9/2006 | Maimon et al. |
| 7,473,576 B2 | 1/2009 | Lung | | 2006/0211165 A1 | 9/2006 | Hwang et al. |
| 7,479,649 B2 | 1/2009 | Lung | | 2006/0226409 A1 | 10/2006 | Burr et al. |
| 7,485,891 B2 | 2/2009 | Hamann et al. | | 2006/0234138 A1 | 10/2006 | Fehlhaber et al. |
| 7,488,968 B2 | 2/2009 | Lee | | 2006/0237756 A1 | 10/2006 | Park et al. |
| 7,502,252 B2 | 3/2009 | Fuji et al. | | 2006/0245236 A1 | 11/2006 | Zaidi |
| 7,507,986 B2 | 3/2009 | Lung | | 2006/0250885 A1 | 11/2006 | Cho et al. |
| 7,514,334 B2 | 4/2009 | Chen et al. | | 2006/0261392 A1 | 11/2006 | Lee et al. |
| 7,514,705 B2 | 4/2009 | Breitwisch et al. | | 2006/0266993 A1 | 11/2006 | Suh et al. |
| 7,515,461 B2 | 4/2009 | Happ et al. | | 2006/0284157 A1 | 12/2006 | Chen et al. |
| 7,551,473 B2 | 6/2009 | Lung et al. | | 2006/0284158 A1 | 12/2006 | Lung et al. |
| 7,569,844 B2 | 8/2009 | Lung | | 2006/0284214 A1 | 12/2006 | Chen |
| 7,651,906 B2 | 1/2010 | Park et al. | | 2006/0284279 A1 | 12/2006 | Lung et al. |
| 7,683,360 B2 | 3/2010 | Chen et al. | | 2006/0286709 A1 | 12/2006 | Lung et al. |
| 7,688,619 B2 | 3/2010 | Lung et al. | | 2006/0286743 A1 | 12/2006 | Lung et al. |
| 7,696,503 B2 | 4/2010 | Lung et al. | | 2006/0289847 A1 | 12/2006 | Dodge |
| 7,701,759 B2 | 4/2010 | Lung et al. | | 2006/0289848 A1 | 12/2006 | Dennison |
| 2002/0017701 A1 | 2/2002 | Klersy et al. | | 2007/0007613 A1 | 1/2007 | Wang et al. |
| 2002/0070457 A1 | 6/2002 | Sun et al. | | 2007/0008786 A1 | 1/2007 | Scheuerlein |
| 2002/0113273 A1 | 8/2002 | Hwang et al. | | 2007/0030721 A1 | 2/2007 | Segal et al. |
| 2002/0168852 A1 | 11/2002 | Harshfield et al. | | 2007/0037101 A1 | 2/2007 | Morioka |
| 2003/0072195 A1 | 4/2003 | Mikolajick | | 2007/0040159 A1 | 2/2007 | Wang |
| 2003/0095426 A1 | 5/2003 | Hush et al. | | 2007/0051936 A1 | 3/2007 | Pellizzer et al. |
| 2003/0116794 A1 | 6/2003 | Lowrey | | 2007/0096162 A1 | 5/2007 | Happ et al. |
| 2003/0186481 A1 | 10/2003 | Lung | | 2007/0096248 A1 | 5/2007 | Philipp et al. |
| 2004/0026686 A1 | 2/2004 | Lung | | 2007/0108077 A1 | 5/2007 | Lung et al. |
| 2004/0051094 A1 | 3/2004 | Ooishi | | 2007/0108429 A1 | 5/2007 | Lung |
| 2004/0113137 A1 | 6/2004 | Lowrey | | 2007/0108430 A1 | 5/2007 | Lung |
| 2004/0165422 A1 | 8/2004 | Hideki et al. | | 2007/0108431 A1 | 5/2007 | Chen et al. |
| 2004/0166604 A1* | 8/2004 | Ha et al. ................ 438/102 | | 2007/0109836 A1 | 5/2007 | Lung |
| 2004/0248339 A1 | 12/2004 | Lung | | 2007/0109843 A1 | 5/2007 | Lung et al. |
| 2004/0256610 A1 | 12/2004 | Lung | | 2007/0111429 A1 | 5/2007 | Lung |
| 2005/0018526 A1 | 1/2005 | Lee | | 2007/0115794 A1 | 5/2007 | Lung |
| 2005/0029502 A1 | 2/2005 | Hudgens | | 2007/0117315 A1 | 5/2007 | Lai et al. |
| 2005/0029587 A1 | 2/2005 | Harshfield | | 2007/0120104 A1 | 5/2007 | Ahn et al. |
| 2005/0052904 A1 | 3/2005 | Cho et al. | | 2007/0121363 A1 | 5/2007 | Lung |

| | | |
|---|---|---|
| 2007/0121374 A1 | 5/2007 | Lung et al. |
| 2007/0126040 A1 | 6/2007 | Lung |
| 2007/0131922 A1 | 6/2007 | Lung |
| 2007/0138458 A1 | 6/2007 | Lung |
| 2007/0147105 A1 | 6/2007 | Lung et al. |
| 2007/0153563 A1 | 7/2007 | Nirschl |
| 2007/0154847 A1 | 7/2007 | Chen et al. |
| 2007/0155172 A1 | 7/2007 | Lai et al. |
| 2007/0156949 A1 | 7/2007 | Rudelic et al. |
| 2007/0158632 A1 | 7/2007 | Ho |
| 2007/0158633 A1 | 7/2007 | Lai et al. |
| 2007/0158645 A1 | 7/2007 | Lung |
| 2007/0158690 A1 | 7/2007 | Ho et al. |
| 2007/0158862 A1 | 7/2007 | Lung |
| 2007/0161186 A1 | 7/2007 | Ho |
| 2007/0170881 A1 | 7/2007 | Noh et al. |
| 2007/0173019 A1 | 7/2007 | Ho et al. |
| 2007/0173063 A1 | 7/2007 | Lung |
| 2007/0176261 A1 | 8/2007 | Lung |
| 2007/0187664 A1 | 8/2007 | Happ |
| 2007/0201267 A1 | 8/2007 | Happ et al. |
| 2007/0215852 A1 | 9/2007 | Lung |
| 2007/0224726 A1 | 9/2007 | Chen et al. |
| 2007/0235811 A1 | 10/2007 | Furukawa et al. |
| 2007/0236989 A1 | 10/2007 | Lung |
| 2007/0246699 A1 | 10/2007 | Lung |
| 2007/0249090 A1 | 10/2007 | Philipp et al. |
| 2007/0252127 A1 | 11/2007 | Arnold et al. |
| 2007/0257300 A1 | 11/2007 | Ho et al. |
| 2007/0262388 A1 | 11/2007 | Ho et al. |
| 2007/0267618 A1 | 11/2007 | Zaidi et al. |
| 2007/0274121 A1 | 11/2007 | Lung et al. |
| 2007/0285960 A1 | 12/2007 | Lung et al. |
| 2007/0298535 A1 | 12/2007 | Lung |
| 2008/0006811 A1 | 1/2008 | Philipp et al. |
| 2008/0012000 A1 | 1/2008 | Harshfield |
| 2008/0014676 A1 | 1/2008 | Lung et al. |
| 2008/0025089 A1 | 1/2008 | Scheuerlein et al. |
| 2008/0043520 A1 | 2/2008 | Chen |
| 2008/0094871 A1 | 4/2008 | Parkinson |
| 2008/0101110 A1 | 5/2008 | Happ et al. |
| 2008/0106923 A1* | 5/2008 | Lung .......................... 365/129 |
| 2008/0137400 A1 | 6/2008 | Chen et al. |
| 2008/0138929 A1 | 6/2008 | Lung |
| 2008/0138930 A1 | 6/2008 | Lung |
| 2008/0138931 A1 | 6/2008 | Lung |
| 2008/0164453 A1 | 7/2008 | Breitwisch et al. |
| 2008/0165569 A1 | 7/2008 | Chen et al. |
| 2008/0165570 A1 | 7/2008 | Happ et al. |
| 2008/0165572 A1 | 7/2008 | Lung |
| 2008/0165573 A1* | 7/2008 | Nirschl et al. ............... 365/163 |
| 2008/0166875 A1 | 7/2008 | Lung |
| 2008/0179582 A1 | 7/2008 | Burr et al. |
| 2008/0180990 A1 | 7/2008 | Lung |
| 2008/0186755 A1 | 8/2008 | Lung et al. |
| 2008/0191187 A1 | 8/2008 | Lung et al. |
| 2008/0192534 A1 | 8/2008 | Lung |
| 2008/0197334 A1 | 8/2008 | Lung |
| 2008/0224119 A1 | 9/2008 | Burr et al. |
| 2008/0225489 A1 | 9/2008 | Cai et al. |
| 2008/0265234 A1 | 10/2008 | Breitwisch et al. |
| 2008/0280401 A1 | 11/2008 | Burr et al. |
| 2008/0303014 A1 | 12/2008 | Goux et al. |
| 2008/0310208 A1 | 12/2008 | Daley |
| 2009/0001341 A1 | 1/2009 | Breitwisch et al. |
| 2009/0014704 A1 | 1/2009 | Chen et al. |
| 2009/0023242 A1 | 1/2009 | Lung |
| 2009/0027950 A1 | 1/2009 | Lam et al. |
| 2009/0042335 A1 | 2/2009 | Lung |
| 2009/0057641 A1 | 3/2009 | Lung |
| 2009/0072215 A1 | 3/2009 | Lung et al. |
| 2009/0098678 A1 | 4/2009 | Lung |
| 2009/0166600 A1 | 7/2009 | Park et al. |
| 2009/0166603 A1 | 7/2009 | Lung |
| 2009/0268507 A1 | 10/2009 | Breitwisch et al. |
| 2009/0289242 A1 | 11/2009 | Breitwisch et al. |
| 2009/0294748 A1 | 12/2009 | Breitwisch et al. |
| 2010/0055830 A1 | 3/2010 | Chen et al. |
| 2010/0084624 A1 | 4/2010 | Lung et al. |
| 2010/0144128 A1 | 6/2010 | Lung et al. |
| 2010/0151652 A1 | 6/2010 | Lung et al. |
| 2010/0157665 A1 | 6/2010 | Lung et al. |
| 2010/0193763 A1 | 8/2010 | Chen et al. |

OTHER PUBLICATIONS

"New Memories Tap Spin, Gird for Battle," Science News, Apr. 3, 1999, p. 223, vol. 155.

"Optimized Thermal Capacitance in a Phase Change Memory Cell Design," IPCOM000141986D, IP.com Prior Art Database, Oct. 18, 2006, 4pp.

"Remembering on the Cheap," www.sciencenews.org, Mar. 19, 2005, p. 189, vol. 167.

"Thermal Conductivity of Crystalline Dielectrics" in CRC Handbook of Chemistry and Physics, Internet Version 2007, (87th edition), David R. Lide, ed. Taylor and Francis, Boca Raton, FL, 2pp.

Adler, D. et al., "Threshold Switching in Chalcogenide-Glass Thin Films," J. Appl/Phys 51(6), Jun. 1980, pp. 3289-3309.

Adler, David, "Amorphous-Semiconductor Devices," Sci. Amer., vol. 236, pp. 36-48, May 1977.

Ahn, S. J. et al., "A Highly Manufacturable High Density Phase Change Memory of 64 Mb and Beyond," IEEE IEDM Dec. 13-15, 2004, pp. 907-910.

Ahn, S. J. et al., "Highly Reliable 5nm Contact Cell Technology for 256Mb PRAM," VLSI Technology, Digest of Technical Papers, Jun. 14-16, 2005, pp. 98-99.

Atwood, G, et al., "90 nm Phase Change Technology with u Trench and Lance Cell Elements," VLSI Technology, Systems and Applications, Apr. 23-25, 2007, pp. 1-2.

Axon Technologies Corporation paper: Technology Description, published at least as early as Dec. 1997, pp. 1-6.

Bedeschi, F. et al., "4-MB MOSFET-Selected Phase-Change Memory Experimental Chip," IEEE, Sep. 21 to 23, 2004, 4 PP.

Blake thesis, "Investigation of GeTeSb5 Chalcogenide Films for Use as an Analog Memory," AFIT/GE/ENG/00M-04, Mar. 2000, 121 pages.

Chao, Der-Sheng, et al., "Low Programming Current Phase Change Memory Cell with Double GST Thermally Confined Structure," Int'l Symp on VLSI Technology, Systems and Applications, Apr. 23-25, 2007, pp. 1-2.

Chen, An et al., "Non-Volatile Resistive Switching for Advanced Memory Applications," IEEE IEDM, Dec. 5-7, 2005, 4 pp.

Cho, S. L. et al., "Highly Scalable On-axis Confined Cell Structure for High Density PRAM beyond 256Mb," Jun. 14-16, 2005 Symposium on VLSI Technology Digest of Technical Papers, pp. 96-97.

Gibson, G. A. et al., "Phase-change Recording Medium that Enables Ultrahigh-density Electron-beam Data Storage," Applied Physics Letter, 2005, 3 pp., vol. 86.

Gill, Manzur et al., "A High-Performance Nonvolatile Memory Technology for Stand-Alone Memory and Embedded Applications," Feb. 3-7, 2002 IEEE-ISSCC Technical Digest (TD 12.4), 7 pp.

Gleixner, "Phase Change Memory Reliability", 22nd NVSMW, Aug. 26, 2007, 46 pages.

Ha, Y. H. et al., "An Edge Contact Type Cell for Phase Change RAM Featuring Very Low Power Consumption," Jun. 10-12, 2003 Symposium on VLSI Technology Digest of Technical Papers, pp. 175-176.

Hanzawa, Satoru, et al., "A 512kB Embedded Phase Change Memory with 416kB/s Write Throughput at 100mA Cell Write Current," ISSCC 2007, Session 26, Non-Volatile Memories/26.2, 3 pages.

Happ, T. D. et al., "Novel None-Mask Self-Heating Pillar Phase Change Memory," 2006 Symposium on VLSI Technology, 2 pp.

Haring Bolivar, P. et al., "Lateral Design for Phase Change Random Access Memory Cells with Low-Current Consumption," presented at 3rd E*PCOS 04 Symposium in Balzers, Principality of Liechtenstein, Sep. 4-7, 2004, 4pp.

Horii, H. et al., "A Novel Cell Technology Using N-doped GeSbTe Films for Phase Change RAM," Jun. 10-12, 2003 Symposium on VLSI Technology Digest of Technical Papers, pp. 177-178.

Hudgens, S. et al., "Overview of Phase-Change Chalcogenide Nonvolatile Memory Technology," MRS Bulletin, Nov. 2004, pp. 829-832.

Hwang, Y. N. et al., "Full Integration and Reliability Evaluation of Phase-change RAM Based on 0.24um-CMOS Technologies," Jun. 10-12, 2003 Symposium on VLSI Technology Digest of Technical Papers, pp. 173-174.

Iwasaki, Hiroko et al., "Completely Erasable Phase Change Optical Disk," Jpn. J. Appl. Phys., Feb. 1992, pp. 461-465, vol. 31.

Jeong, C. W. et al., "Switching Current Scaling and Reliability Evaluation in PRAM," IEEE Non-Volatile Semiconductor Memory Workshop, Monterey, CA 2004, pp. 28-29 and workshop cover sheet.

Kim, Kinam et al., "Reliability Investigations for Manufacturable High Density PRAM," IEEE 43rd Annual International Reliability Physics Symposium, San Jose, Apr. 17-21, 2005, pp. 157-162.

Kojima, Rie et al., "Ge-Sn-Sb-Te Phase-change Recording Material Having High Crystallization Speed," Proceedings of PCOS 2000, pp. 36-41.

Lacita, A. L., "Electrothermal and Phase-change Dynamics in Chalcogenide-based Memories," IEEE IEDM Dec. 13-15, 2004, 4 pp.

Lai, Stefan, "Current Status of the Phase Change Memory and Its Future," IEEE IEDM Dec. 10, 2003, pp. 255-258.

Lai, Stephan et al., "OUM-A 180 nm Nonvolatile Memory Cell Element Technology for Stand Alone and Embedded Applications," IEEE IEDM Dec. 2-5, 2001, pp. 803-806.

Lankhorst, Martijn H.R., et al; Low-Cost and Nanoscale Non-Volatile Memory Concept for Future Silicon Chips, Mar. 13, 2005, 6 pp., Nature Materials Advance Online Publication, www.nature.com/naturematerials.

Li, Yiming, "Temperature dependence on the contact size of GeSbTe films for phase change memories," J. Comput Electron (2008) 7:138-141.

Mott, Nevill, "Electrons in Glass," Nobel Lecture, Dec. 8, 1977, Physics, 1977, pp. 403-413.

Oh, Hyung-Rok, et al., "Enhanced Write Performance of a 64Mb Phase-Change Random Access Memory," ISSCC 2005, Session 2, Non-Volatile Memory, 2.3, 3 pages.

Ovonyx Non-Confidential paper entitled "Ovonic Unified Memory," Dec. 1999, pp. 1-80.

Ovshinsky, Sandford R., "Reversible Electrical Switching Phenomena in Disordered Structures," Physical Review Letters, vol. 21, No. 20, Nov. 11, 1968, pp. 1450-1453.

Owen, Alan E. et al., "Electronic Conduction and Switching in Chalcogenide Glasses," IEEE Transactions on Electron Devices, vol. Ed. 20, No. 2, Feb. 1973, pp. 105-122.

Pellizer, F. et al.,"Novel u Trench Phase—Change Memory Cell for Embedded and Stand-Alone Non-Volatile Memory Applications," Jun. 15-17, 2004 Symposium on VLSI Technology Digest of Technical Papers, pp. 18-19.

Pirovano, Agostino et al.,"Reliability Study of Phase-Change Nonvolatile Memories," IEEE Transactions on Device and Materials Reliability, Sep. 2004, pp. 422-427, vol. 4, No. 3.

Prakash, S. et al., "A guideline for Designing Chalcogenide-Based Glasses for Threshold Switching Characteristics," IEEE Electron Device Letters, vol. 18, No. 2, Feb. 1997, pp. 45-47.

Radaelli, A. et al., "Electronic Switching Effect and Phase-Change Transition in Chalcogenide Materials," IEEE Electron Device Letters, Oct. 2004, pp. 684-686, vol. 25, No. 10.

Rochefort, C. et al., "Manufacturing of High Aspect-Ration p-n Junctions Using Vapor Phase Doping for Application in Multi-Resurf Devices," IEEE Jun. 4-7, 2002, pp. 237-240.

Schafft, Harry A. et al., "Thermal Conductivity Measurements of Thin Films Silicon Dioxide," Proceedings of the IEEE 1989 International Conference on Microelectronic Test Structures vol. 2, No. 1, Mar. 1989, pp. 121-124.

Strauss, Karl F. et al., "Overview of Radiation Tolerant Unlimited Write Cycle Non-Volatile Memory," IEEE Mar. 18-25, 2000, pp. 399-408.

Subramanian, Vivek et al., "Low Leakage Germanium-Seeded Laterally-Crystallized Single-Grain 100-nm TFT's for Vertical Integration Applications," IEEE Electron Device Letters, vol. 20, No. 7, Jul. 1999, pp. 341-343.

Wicker, Guy et al., Nonvolatile, High Density, High Performance Phase Change Memory, 1999, http://klabs.org/richcontent/MAPLDCon99/Papers/P21_Tyson_P.PDF#search='nonvolatile%20high%20density%20high%20performance%20phase%20change%20memory', 8pages.

Wicker, Guy, "A Comprehensive Model of Submicron Chalcogenide Switching Devices," Doctoral Dissertation, Wayne State University, Detroit, MI 1996, 137 pp.

Wolf, Stanley, Excerpt from: Silicon Processing for the VLSI Era-vol. 4, pp. 674-679, 2004.

Wuttig, Matthias, "Towards a Universal Memory?" Nature Materials, Apr. 2005, pp. 265-266, vol. 4.

Yamada, Noboru, "Potential of Ge-Sb-Te phase-change optical disks for high-data-rate recording in the near future," (Conference Proceedings Paper), Jul. 30, 1997, vol. 3109, 10 pages.

Yi, J. H. et al., "Novel Cell Structure of PRAM with Thin Metal Layer Inserted GeSbTe," IEEE IEDM Dec. 10, 2003, 4 pages.

Yonehara, T. et al., "Control of Grain Boundary Location by Selective Nucleation Over Amorphous Substrates," Mat. Res. Soc. Symp. Proc., vol. 106, 1998, pp. 21-26.

* cited by examiner

PHASE CHANGE MEMORY WITH DUAL WORD LINES AND SOURCE LINES AND METHOD OF OPERATING SAME

RELATED APPLICATIONS

This application is a continuation of co-pending U.S. patent application Ser. No. 11/833,143 filed on 2 Aug. 2007 which is incorporated herein by reference.

PARTIES TO A JOINT RESEARCH AGREEMENT

International Business Machines Corporation, a New York corporation; Macronix International Corporation, Ltd., a Taiwan corporation, and Infineon Technologies A.G., a German corporation, are parties to a Joint Research Agreement.

BACKGROUND OF THE INVENTION

1. Field of the Invention

The present invention relates to high density memory devices based on phase change based memory materials, including chalcogenide based materials and other materials, and to methods for operating such devices.

2. Description of Related Art

Phase change based memory materials are widely used in read-write optical disks. These materials have at least two solid phases, including for example a generally amorphous solid phase and a generally crystalline solid phase. Laser pulses are used in read-write optical disks to switch between phases and to read the optical properties of the material that differ in the two phases.

Phase change based memory materials, like chalcogenide based materials and similar materials, also can be caused to change phase by application of electrical current at levels suitable for implementation in integrated circuits. The generally amorphous state is characterized by higher resistivity than the generally crystalline state, which can be readily sensed to indicate data. These properties have generated interest in using programmable resistive material to form nonvolatile memory circuits, which can be read and written with random access.

The change from the amorphous to the crystalline state is generally a lower current operation. The change from crystalline to amorphous, referred to as reset herein, is generally a higher current operation, which includes a short high current density pulse to melt or break down the crystalline structure, after which the phase change material cools quickly, quenching the phase change process and allowing at least a portion of the phase change structure to stabilize in the amorphous state. It is desirable to minimize the magnitude of the reset current used to cause transition of phase change material from crystalline state to amorphous state. The magnitude of the reset current needed for reset can be reduced by reducing the size of the phase change material element in the cell and of the contact area between electrodes and the phase change material, so that higher current densities are achieved with small absolute current values through the phase change material element. Even with small devices, the reset current remains a design limitation for high density and low voltage integrated circuits.

As the phase change memory cell structures are made small, a limiting factor on the density of a device incorporating an array of phase change memory cells is the array architecture, including access transistors, word lines and bit lines through which individual memory cells are accessed for read, set and reset operations. Typical array architectures are shown in Lung, "Spacer Chalcogenide Memory Method and Device," U.S. Pat. No. 6,864,503; and Wu, "Self-Aligned Resistive Plugs for Forming Memory Cell with Phase Change Material," U.S. Pat. No. 6,545,903. In the '503 patent, the architecture for an array of phase change memory cells is shown in FIG. 3, and includes access transistors (called isolation transistors in the '503 patent) that are formed on a semiconductor substrate, and a conductive plug formed in a contact via is formed between the drain of each access transistor and an electrode in the corresponding phase change memory cell. The array size is limited by the need to space the access transistors apart from one another in the semiconductor substrate, or to otherwise isolate adjacent access transistors. One array architecture that provides for high density is shown in Kang, et al., "A 0.1 mM 1.8V 256 Mb 66 MHz Synchronous Burst PRAM", ISSCC, February, 2006.

It is desirable therefore to provide devices with an array architecture supporting high-density devices, and to facilitate applying relatively high currents to selected devices for reset operations at low voltages.

SUMMARY OF THE INVENTION

A memory device comprising a memory cell and dual access devices is described in which the memory cell has a first electrode, a second electrode and a memory element between the first and second electrodes. The memory cell comprises a phase change memory cell in embodiments described herein. The phase change material in the memory element in the memory cell has an amorphous phase and a crystalline phase. In the reset state of the memory cell, substantially all of an active region of the memory element is in the amorphous phase. In the set state at least a substantial portion of the active region of the memory element is in the crystalline phase. In multilevel cells, there may be more than one "set" state in which various amounts of the active region are in the crystalline state. The memory device includes a first word line conductor and a second word line conductor, and first and second access devices responsive to voltages on the first and second word line conductors, respectively. The first and second access devices have respective cell contacts and source line contacts. A memory cell has a first electrode in electrical communication with the cell contacts of the first and second access devices. A bit line is in electrical communication with the second electrode of the memory cell. Control circuits are arranged to access the memory cell for read operations using only the first word line conductor to establish a current path from the bit line through the memory cell to the source line contact of the first access device. The control circuits are arranged to access memory cell for operations to reset the memory cell using both the first and second word line conductors to establish a current path from the bit line through the memory cell to both of the first and second source line contacts. In embodiments described herein, at least one of the first and second access devices comprises a diode. In other embodiments, at least one of the first and second access devices comprises a transistor.

A memory device is described which is implemented on a semiconductor substrate. The semiconductor substrate has a gate dielectric layer over portions of the substrate. A first word line conductor overlies the gate dielectric layer. A second word line conductor arranged in parallel with the first word line conductor also overlies the gate dielectric layer. A plurality of doped regions in a semiconductor substrate provide source and drain terminals adjacent to the first and second word line conductors forming pairs of access transistors. A first source line conductor contacts the source terminal of a first access transistor in the pair of access transistors. A second source line conductor contacts the source terminal of a second access transistor in the pair of access transistors. A memory cell comprising a first electrode, a second electrode and a memory element has a first electrode in electrical communication with the drain terminals of both the first and second access transistors (which may be a shared doped region in the substrate). A bit line is in electrical communication with the second electrode of the memory cell. Read and write control circuits are coupled to the first and second word lines and to the bit line. The control circuits operate to access the memory cell for read, set and reset operations. For read operations, the control circuits are operable to access the memory cell using only the first word line conductor. For the set operations, the control circuits are operable to access the memory cell using only one of the first and second word line conductors, or alternatively, both. For reset operations, the control circuits are operable to access memory cell using both the first and second word line conductors.

The memory cell and access control device structure described enables dense, high capacity memory arrays using phase change memory cells operating at low voltages.

Other aspects and advantages of the invention are described below with reference to the figures.

DETAILED DESCRIPTION

A detailed description of phase change memory cells with dual access transistors, arrays of such memory cells, and methods for manufacturing and operating such memory cells, is provided with reference to FIGS. 1-18.

Figure 1:
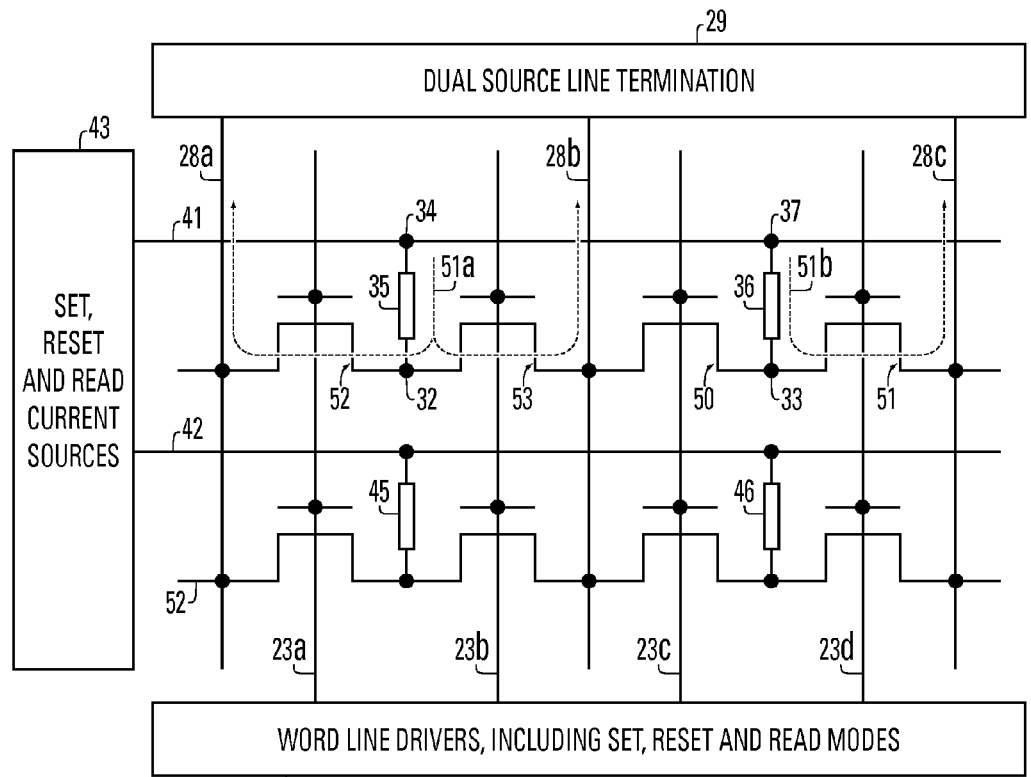
FIG. 1 is a schematic diagram for a memory array comprising phase change memory cells with dual source lines and dual word lines.

FIG. 1 is a schematic illustration of a memory array, with dual word lines and dual source lines, and self-aligned contacts between memory cell electrodes and the access array, which can be implemented as described herein. Four memory cells including memory elements 35, 36, 45 and 46 are illustrated, representing a small section of an array that can include millions of memory cells. Memory cells including memory elements 35 and 36 are representative. As can be seen, the memory cell including memory element 35 includes a top electrode 34 and a bottom electrode 32, with the memory element 35 comprising a phase change material in electrical communication with the top and bottom electrodes 34, 32. Likewise, the memory cell including memory element 36 includes a top electrode 37 and a bottom electrode 33. The top electrodes 37, 34 are coupled to a bit line 41. The memory cells including memory elements 45 and 46 are connected in a similar fashion.

FIG. 1, the common source lines 28a, 28b and 28c, the word lines 23a, 23b, 23c and 23d are arranged generally parallel in the Y-direction (as opposed to the normal convention of illustrating word lines arranged in the X-direction). Bit lines 41 and 42 are arranged generally parallel in the X-direction. Thus, a Y-decoder and a word line driver 24, having set, reset and read modes, are coupled to the word lines 23a, 23b, 23c, 23d. Bit line current sources 43 for set, reset and read modes, a decoder and sense amplifiers (not shown) are coupled to the bit lines 41 and 42. The common source lines 28a, 28b and 28c are coupled to source line termination circuit 29, such as a ground terminal. The source line termination circuits may include bias circuits such as voltage sources and current sources, and decoding circuits for applying bias arrangements, other than ground, to the source lines in some embodiments.

Each memory cell in the illustrated array is coupled to first and second access transistors. Thus, the bottom electrode 32 of the memory cell including memory element 35 is coupled to the drain of access transistor 53 and to the drain of access transistor 52. The source terminals of access transistors 52 and 53 are coupled to respective source lines 28a and 28b. The gate of access transistor 52 is coupled to the word line 23a. The gate of access transistor 53 is coupled to the word line 23b. In a similar fashion, the bottom electrode 33 of the memory cell including memory element 36 is coupled to the drain of access transistor 50 and to the drain of access transistor 51. The source terminals of access transistors 50 and 51 are coupled to respective source lines 28b and 28c. The gate of access transistor 50 is coupled to the word line 23c. The gate of access transistor 51 is coupled to the word line 23d.

It can be seen that the common source line 28b is shared by two rows of memory cells, where a row is arranged in the Y-direction in the illustrated schematic.

In operation, current sources 43 and the word line drivers 24 operate in a lower current read mode, one or more intermediate current set modes, and a higher current reset mode. During the higher current reset mode, a current path 51a through the selected memory cell (e.g. memory cell including element 35) is established by applying a current to the bit line 41, and voltages on the word line conductors 23a and 23b sufficient to turn on the access transistors 52 and 53, so that the current flows through both source line 28a and source line 28b. The dual word line conductors 23a, 23b and the dual source line conductors 28a and 28b, establish a lower resistance path to ground than can be established using only a single source line conductor. Therefore, the current source used during the higher current reset mode can operate at lower voltages, and more efficiently couple power to the memory element needed to achieve the reset state.

In contrast, during the lower current read mode, a current path 51b through the selected memory cell (see the memory cell including memory element 36) is established by applying a current to the bit line 41, and a voltage on the word line conductor 23d sufficient to turn on the access transistor 51 and provide for current flow to the source line conductor 28c. The voltage on the word line conductor 23c is kept at a level that is sufficient to turn off the access transistor 50, and block current flow to the source line conductor 28b. This provides for a lower capacitance in the circuitry used in the lower current read mode, and allows for faster operation of the read mode.

During the set mode, used for one or more intermediate current levels, only one access transistor is enabled, as just described with respect to the read mode. Alternatively, during the set mode, two access transistors may be utilized as described above with respect to the reset mode, depending on the design goals of the particular implementation.

Figure 2:
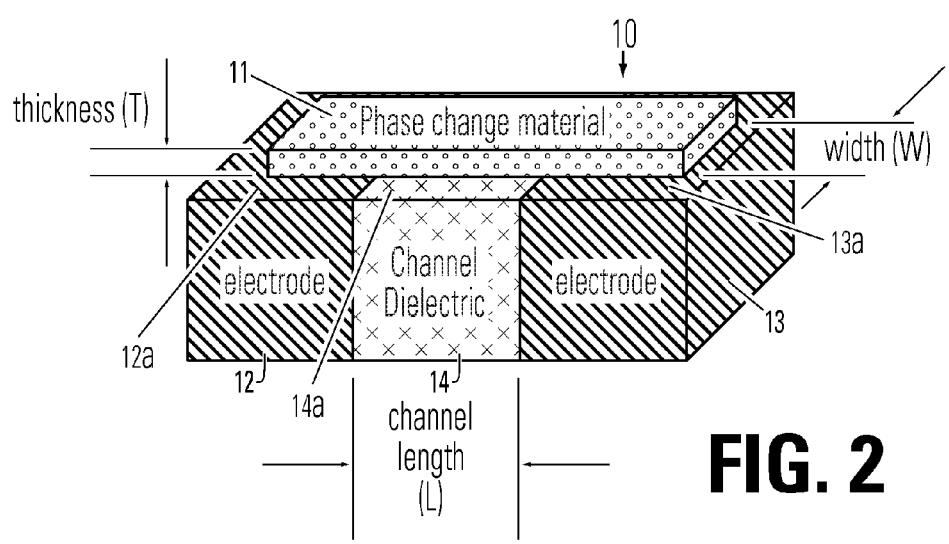
FIG. 2 illustrates a thin film bridge phase change memory element suitable for use in an array structure as shown in FIG. 1.

FIG. 2 illustrates a basic structure of a memory cell 10 suitable for use in the array structure shown in FIG. 1, with self-aligned contacts. It will be understood that the array structure illustrated in FIG. 1 can be implemented using other cell structures, including a mushroom cell and a pillar type cell.

The memory cell 10 shown in FIG. 2 includes a bridge 11 of memory material on an electrode layer which comprises a first electrode 12, a second electrode 13, and an insulating member 14 between the first electrode 12 and the second electrode 13. As illustrated, the first and second electrodes 12, 13 have top surfaces 12a and 13a. Likewise the insulating member 14 has a top surface 14a. The top surfaces 12a, 13a, 14a of the structures in the electrode layer define a substantially planar top surface for the electrode layer in the illustrated embodiment. The bridge 11 of memory material lies on the planar top surface of the electrode layer, so that contacts between the first electrode 12 and the bridge 11 and between the second electrode 13 and the bridge 11 are made on the bottom side of the bridge 11. The length L (x-dimension) of the active channel is defined by the thickness of the insulating member 14 (called channel dielectric in the figure), between the first electrode 12 and the second electrode 13. This length L can be controlled by controlling the width of the insulating member 14 in embodiments of the memory cell. In representative embodiments, the width of the insulating member 14 can be established using a thin film deposition technique to form a thin sidewall dielectric on the side of an electrode stack. Thus, embodiments of the memory cell have a channel length L less than 100 nm. Other embodiments have a channel length L of about 40 nm or less. In yet other embodiments, the channel length is less than 20 nm. It will be understood that the channel length L can be even smaller than 20 nm, using thin-film deposition techniques such as atomic layer deposition and the like, according to the needs of the particular application.

Likewise, the bridge thickness T (y-dimension) can be very small in embodiments of the memory cell. This bridge thickness T can be established using a thin film deposition technique on the top surfaces of the first electrode 12, insulating member 14, and second electrode 13. Thus, embodiments of the memory cell have a bridge thickness T about 50 nm or less. Other embodiments of the memory cell have a bridge thickness of about 20 nm or less. In yet other embodiments, the bridge thickness T is about 10 nm or less. It will be understood that the bridge thickness T can be even smaller than 10 nm, using thin film deposition techniques such as atomic layer deposition and the like, according to the needs of the particular application, so long as the thickness is sufficient for the bridge to perform its purpose as memory element, having at least two solid phases, reversible by a current or by a voltage applied across the first and second electrodes.

As illustrated in FIG. 2, the bridge width W (z-dimension) is likewise very small. This bridge width W is implemented in preferred embodiments, so that it has a width less than 100 nm. In some embodiments, the bridge width W is about 40 nm or less.

Embodiments of the memory cell include phase change based memory materials, including chalcogenide based materials and other materials, for the bridge 11. Chalcogens include any of the four elements oxygen (O), sulfur (S), selenium (Se), and tellurium (Te), forming part of group VI of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from column six of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_a Ge_b Sb_{100-(a+b)}$.

One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. These percentages are atomic percentages that total 100% of the atoms of the constituent elements. (Ovshinsky '112 patent, cols 10-11.) Particular alloys evaluated by another researcher include $Ge_2Sb_2Te_5$, $GeSb_2Te_4$ and $GeSb_4Te_7$. (Noboru Yamada, "Potential of Ge—Sb—Te Phase-Change Optical Disks for High-Data-Rate Recording", SPIE v.3109, pp. 28-37 (1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistive properties. Specific examples of memory materials that may be useful are given in Ovshinsky '112 at columns 11-13, which examples are hereby incorporated by reference.

Phase change alloys are capable of being switched between a first structural state in which the material is in a generally amorphous solid phase, and a second structural state in which the material is in a generally crystalline solid phase in its local order in the active channel region of the cell. These alloys are at least bistable. The term amorphous is used to refer to a relatively less ordered structure, more disordered than a single crystal, which has the detectable characteristics such as higher electrical resistivity than the crystalline phase. The term crystalline is used to refer to a relatively more ordered structure, more ordered than in an amorphous structure, which has detectable characteristics such as lower electrical resistivity than the amorphous phase. Typically, phase change materials may be electrically switched between different detectable states of local order across the spectrum between completely amorphous and completely crystalline states. Other material characteristics affected by the change between amorphous and crystalline phases include atomic order, free electron density and activation energy. The material may be switched either into different solid phases or into mixtures of two or more solid phases, providing a gray scale between completely amorphous and completely crystalline states. The electrical properties in the material may vary accordingly.

Phase change alloys can be changed from one phase state to another by application of electrical pulses. It has been observed that a shorter, higher amplitude pulse tends to change the phase change material to a generally amorphous state. A longer, lower amplitude pulse tends to change the phase change material to a generally crystalline state. The energy in a shorter, higher amplitude pulse is high enough to allow for bonds of the crystalline structure to be broken and short enough to prevent the atoms from realigning into a crystalline state. Appropriate profiles for pulses can be determined empirically or by modeling, and specifically adapted to a particular phase change alloy. In following sections of the disclosure, the phase change material is referred to as GST, and it will be understood that other types of phase change materials can be used. A material useful for implementation of a PCRAM described herein is $Ge_2Sb_2Te_5$.

An exemplary method for forming chalcogenide material uses the PVD-sputtering or magnetron-sputtering method with source gas(es) of Ar, $N_2$, and/or He, etc. at the pressure of 1 mTorr~100 mTorr. The deposition is usually done at room temperature. A collimator with an aspect ratio of 1~5 can be used to improve the fill-in performance. To improve the fill-in performance, a DC bias of several tens of volts to several hundreds of volts is also used. On the other hand, the combination of DC bias and the collimator can be used simultaneously.

A post-deposition annealing treatment in vacuum or in an $N_2$ ambient is optionally performed to improve the crystallize state of chalcogenide material. The annealing temperature typically ranges from 100° C. to 400° C. with an anneal time of less than 30 minutes.

The thickness of chalcogenide material depends on the design of cell structure. In general, a chalcogenide material with thickness of higher than 8 nm can have a phase change characterization so that the material exhibits at least two stable resistance states. It is expected that some materials are suitable with even lower thicknesses.

Thus, a memory cell suitable for the array structure of FIG. 1 comprises a first electrode having a top side, a second electrode having a top side and an insulating member between the first electrode and the second electrode. The insulating member has a thickness between the first and second electrodes near the top side of the first electrode and the top side of the second electrode. A thin film bridge crosses the insulating member, and defines an inter-electrode path between the first and second electrodes across the insulating member. The inter-electrode path across the insulating member has a path length defined by the width of the insulating member. For the purpose of illustration, the bridge can be thought of as having a structure like a fuse. For the phase change memory however, and unlike a fuse, the bridge comprises memory material such as a chalcogenide-based material or other related material, having at least two solid phases that are reversible, by applying a current through the material or applying a voltage across the first and second electrodes.

The volume of memory material subject to phase change can be very small, determined to a significant degree by the thickness of the insulating member (path length in the x-direction), the thickness of the thin film used to form the bridge (y-direction), and the width of the bridge orthogonal to the path length (z-direction). The thickness of the insulating member and the thickness of the thin film of memory material used to form the bridge are determined in embodiments of the technology by thin film thicknesses which are not limited by the lithographic processes used in patterning photoresist for manufacturing the memory cell. The width of the bridge is also smaller than a minimum feature size F that is specified for a lithographic process used in patterning the layer of material in embodiments of the present invention. In one embodiment, the width of the bridge is defined using photoresist trimming technologies in which a mask pattern is used to define a lithographical photoresist structure on the chip having the minimum feature size F, and the photoresist structure is trimmed by isotropic etching to achieve a feature size less than F. The trimmed photoresist structure is then used to lithographically transfer the narrower pattern onto the layer of memory material. Also, other techniques can be used to form narrow lines of material in a layer on an integrated circuit. Accordingly, a phase change memory cell with simple structure achieves very small reset current and low power consumption, and is easily manufactured.

Figure 3:
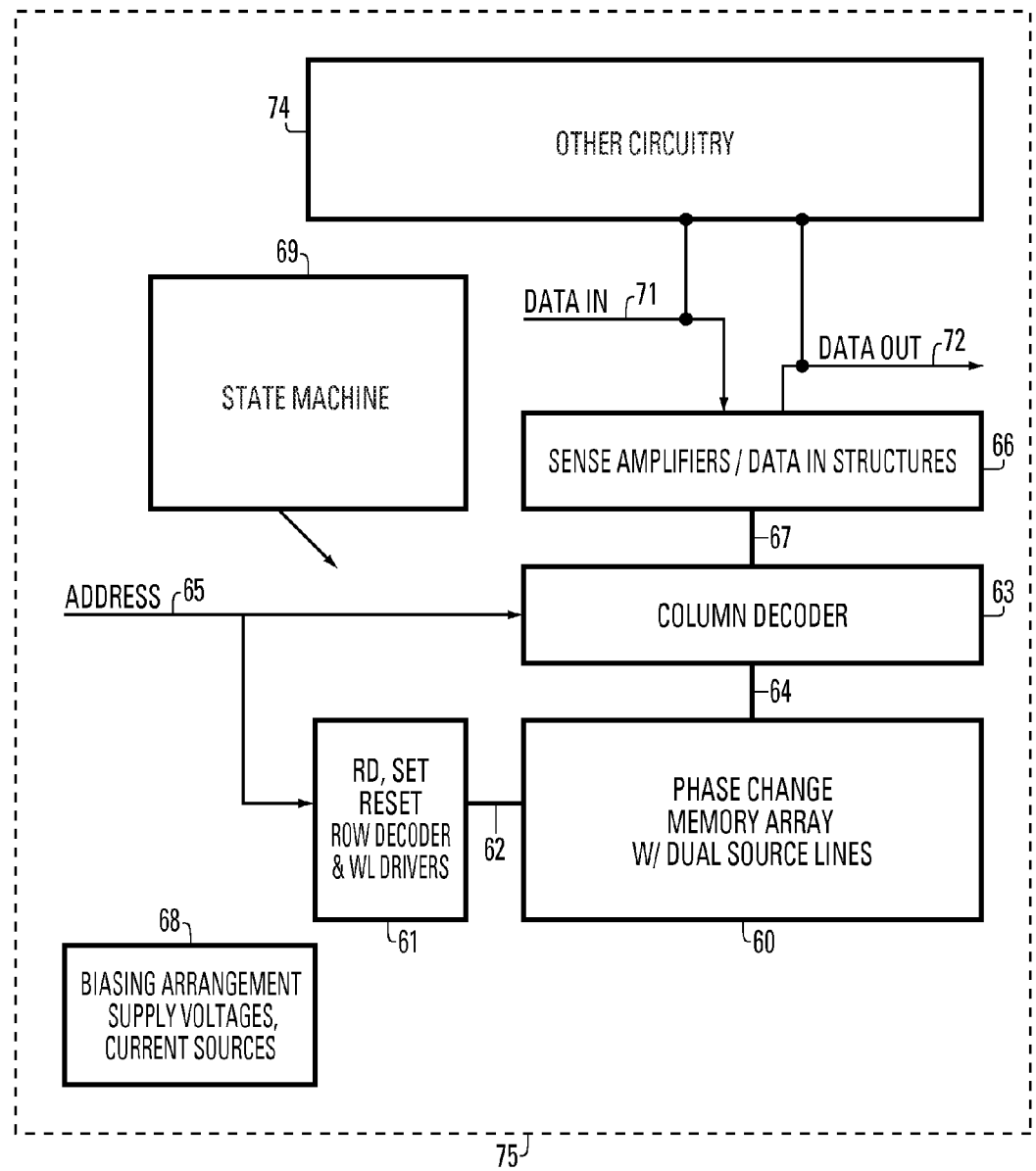
FIG. 3 is a block diagram of an integrated circuit device including a phase change memory array with dual source lines and dual word lines, and other circuitry.

FIG. 3 is a simplified block diagram of an integrated circuit according to an embodiment of the present invention. The integrated circuit 75 includes a memory array 60 implemented using phase change memory cells with self-aligned contacts and isolation lines, on a semiconductor substrate. A row decoder 61 having read, set and reset modes is coupled to a plurality 62 of pairs of word lines, and arranged along rows in the memory array 60. A column decoder 63 is coupled to a plurality of bit lines 64 arranged along columns in the memory array 60 for reading, setting and resetting memory cells in the memory array 60. Addresses are supplied on bus 65 to column decoder 63 and row decoder 61. Sense amplifiers and data-in structures in block 66, including current sources for the read, set and reset modes, are coupled to the column decoder 63 via data bus 67. Data is supplied via the data-in line 71 from input/output ports on the integrated circuit 75 or from other data sources internal or external to the integrated circuit 75, to the data-in structures in block 66. In the illustrated embodiment, other circuitry 74 is included on the integrated circuit 75, such as a general purpose processor or special purpose application circuitry, or a combination of modules providing system-on-a-chip functionality supported by the phase change memory cell array. Data is supplied via the data-out line 72 from the sense amplifiers in block 66 to input/output ports on the integrated circuit 75, or to other data destinations internal or external to the integrated circuit 75.

A controller implemented in this example using bias arrangement state machine 69 controls the application of bias arrangement supply voltages and current sources 68, such as read, set, reset and verify voltages and or currents for the word lines and bit lines, and controls the dual word line/source line operation using an access control process such as described below with reference to FIG. 18. The controller can be implemented using special-purpose logic circuitry as known in the art. In alternative embodiments, the controller comprises a general-purpose processor, which may be implemented on the same integrated circuit, which executes a computer program to control the operations of the device. In yet other embodiments, a combination of special-purpose logic circuitry and a general-purpose processor may be utilized for implementation of the controller.

Figure 15:
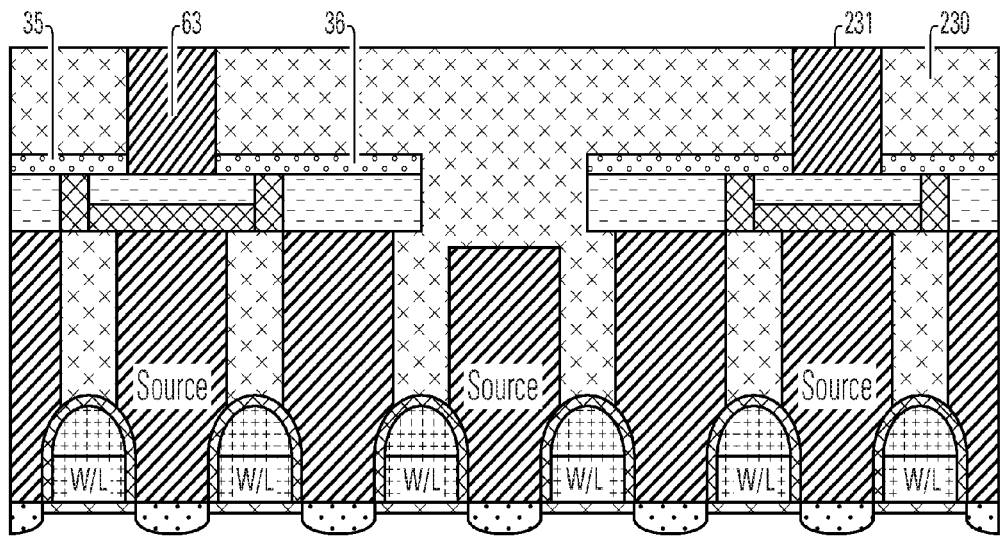
FIG. 15 shows a cross-sectional view corresponding to stages for forming a dielectric fill layer over the structure shown in FIG. 14, including the electrode layer and the bridges of phase change material, and formation of conductive plugs in the dielectric fill layer contacting the bridges of phase change material.
Figure 16:
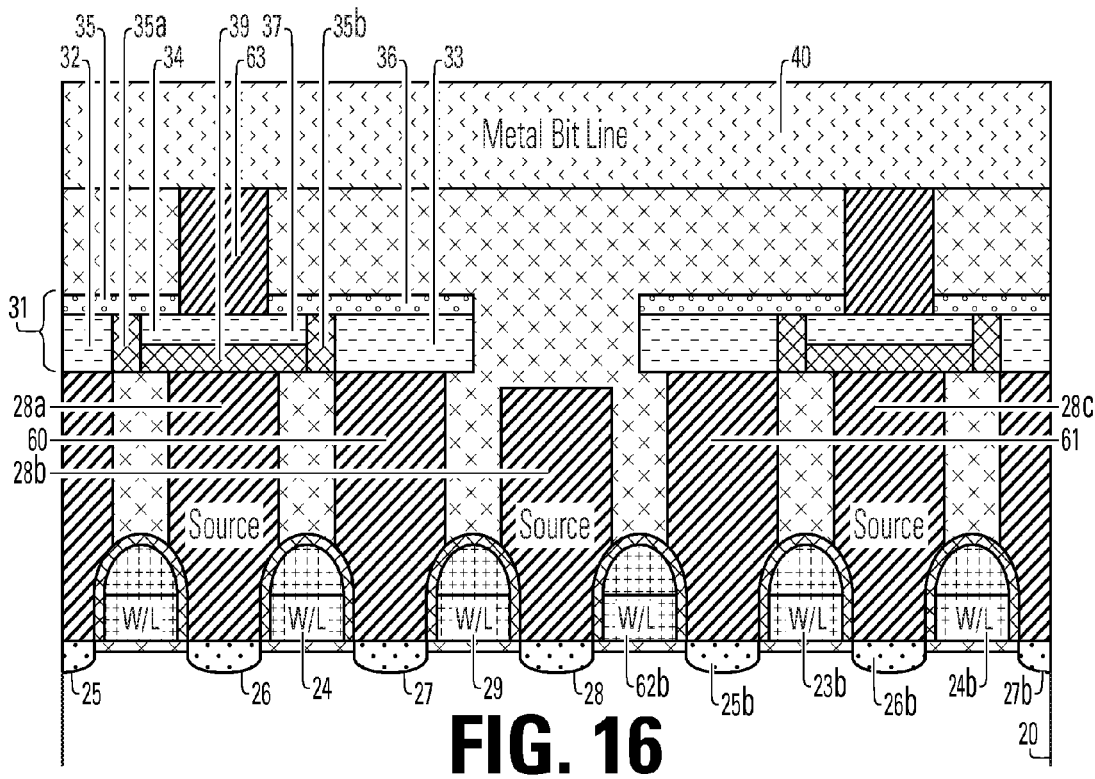
FIG. 16 shows a cross-sectional view of a row of cells in the architecture described herein, corresponding to stages for forming a patterned conductive layer structure over the structure shown in FIG. 15.

FIG. 16 depicts a structure for a phase change random access memory (PCRAM) cells and self-aligned contacts with access transistors, manufactured as described with reference to FIGS. 4-16. The cells are formed on a semiconductor substrate 20. Access transistor pairs are formed by n-type terminals 26 and 28 acting as source regions and n-type terminal 27 acting as a drain region in a p-type substrate 20. Polysilicon word lines 24 and 29 form the gates of the access transistors for memory element 36. The polysilicon word lines include silicide caps, and are lined with silicon nitride or other insulating material. The pattern repeats along the column of access transistors. Polysilicon word line 23 is the gate of an access transistor for a pair on the left. Polysilicon word lines 62b and 23b form the gates of the access transistors in the pair on the right. The terminals 25, 25b, 26, 26b, 27, 27b, and 28 of the access transistors comprise doped regions in the substrate which can be implemented by self-aligned implant processes using the polysilicon lines as masks.

A dielectric fill layer is formed over the polysilicon word lines. The layer is patterned to form contact vias and source line trenches, and then conductive structures, including common source lines 28a, 28b and 28c and plug structures 60 and 61 are formed by filling the vias and trenches with a conductive material. The conductive material can be tungsten or other materials and combinations suitable for the plug and line structures. The common source line 28a contacts the source terminal 26. The common source line 28b contacts the source terminal 28. The plug structures 60 and 61 contact the terminals 27 and 25b, respectively. The fill layer, the common source lines 28a, 28b and the plug structures 60 and 61, have a generally planar top surface, suitable for formation of an electrode layer 31. In alternative embodiments, the common source lines can be implemented using buried diffusion lines in the substrate, or other configurations of conductive lines that may or may not extend to the top surface.

The plug structures 60 and 61 provide contacts between the access structures and electrodes on the memory elements as described below, and are formed in vias that are self-aligned on one side with the word lines 24 and 23b, respectively, and on another side with the word lines 29 and 62b, respectively. The self-alignment arises in the embodiment described herein by using the word line structures to define edges of vias that are etched to provide space for the plugs, thereby aligning the plugs with the word line structures without requiring alignment of an additional lithographic mask to locate the vias.

An electrode layer 31 is formed over the access transistor layer, and includes electrode members 32, 33 and 34 (also acting as electrode member 37), which are separated from one another by an insulating member including fences 35a and 35b formed for example by a sidewall process as described above, and base member 39. The base member 39 can be thicker than the fences 35a, 35b in embodiments of the structure, and separates the electrode member 34 from the common source line 28a. For example the base member can be for instance, 80 to 140 nm thick while the fences are much narrower, as needed to reduce capacitive coupling between the common source line 28a and the electrode member 33. The fences 35a, 35b comprise a thin film dielectric material on the sidewalls of electrode members 32, 33 in the illustrated embodiment, with a thickness at the surface of the electrode layer 31 determined by the thin film thickness on the sidewalls.

A thin film bridge 36 of memory material, such as GST, overlies the electrode layer 31 on one side traversing across the fence member 35b, forming a first memory cell, and a thin film bridge 35 of memory material, such as GST, overlies the electrode layer 31 on another side traversing across the fence member 35a, forming a second memory cell.

Another dielectric fill layer overlies the thin film bridges 35 and 36. Optionally, a protective layer and thermal isolation layers are formed to protect the memory material. The dielectric fill layer comprises silicon dioxide, a polyimide, silicon nitride or other dielectric fill materials. In embodiments, the fill layer comprises a relatively good insulator for heat as well as for electricity, providing thermal and electrical isolation for the bridges. Tungsten plug 63 contacts the electrode member 34. A patterned conductive layer (including bit line 40), comprising metal or other conductive material, including bit lines in an array structure, overlies the dielectric fill layer, and contacts the plug 63 to establish access to the memory cells corresponding to the thin film bridge 35 and the thin film bridge 36.

It will be understood that a wide variety of materials can be utilized in implementation of the structure illustrated in FIG. 16. For example, copper metallization can be used. Other types of metallization, including aluminum, titanium nitride, and tungsten based materials can be utilized as well. Also, non-metal conductive material such as doped polysilicon can be used. The electrode material in the illustrated embodiment is preferably TiN or TaN. Alternatively, the electrodes may be TiAlN or TaAlN, or may comprise, for further examples, one or more elements selected from the group consisting of Ti, W, Mo, Al, Ta, Cu, Pt, Ir, La, Ni, and Ru and alloys thereof. The inter-electrode fence members 35a, 35b may be silicon oxide, silicon oxynitride, silicon nitride, $Al_2O_3$, or other low K dielectrics. Alternatively, the inter-electrode insulating layer may comprise compounds having one or more elements selected from the group consisting of Si, Ti, Al, Ta, N, O, and C.

Figure 4:
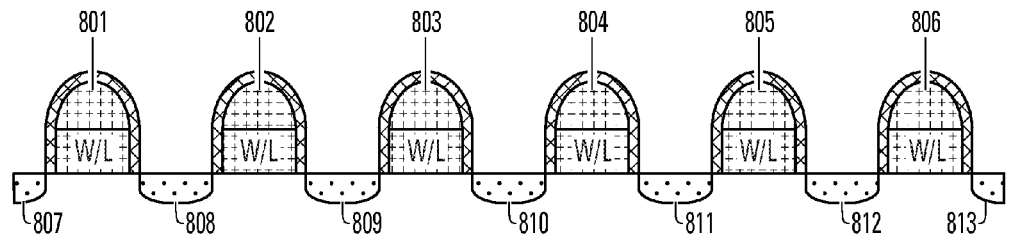
FIG. 4 illustrates a first stage of the front-end-of-line processes forming dual access devices with self-aligned contacts for an implementation of a memory architecture described herein.

FIGS. 4-9 illustrate an approach to manufacturing the front-end-of-line structures on a semiconductor substrate with self-aligned contact vias for connection to the electrode layer, allowing for smaller footprints in the memory cell layout. The process includes laying out a plurality of parallel conductive lines, manufactured for example using polysilicon with silicide caps, and forming implants to provide source and drain terminals between the parallel conductive lines. A cross-section of the structure resulting from these steps is shown in FIG. 4, in which the parallel conductive lines 801-806 overlie gate dielectric layer (not shown) on a semiconductor substrate having doped regions 807-813 which define source and drain terminals between the conductive lines 801-806. In the illustrated embodiment, the conductive lines 801, 802, 803, 804, 805, 806 act as word lines for access transistors. The substrate in an embodiment of the memory device comprises a bulk silicon crystalline wafer or chip. In other embodiments, the substrate may include more complex, multi-layered structures, such as silicon on sapphire, or epitaxial silicon structures.

Figure 5:
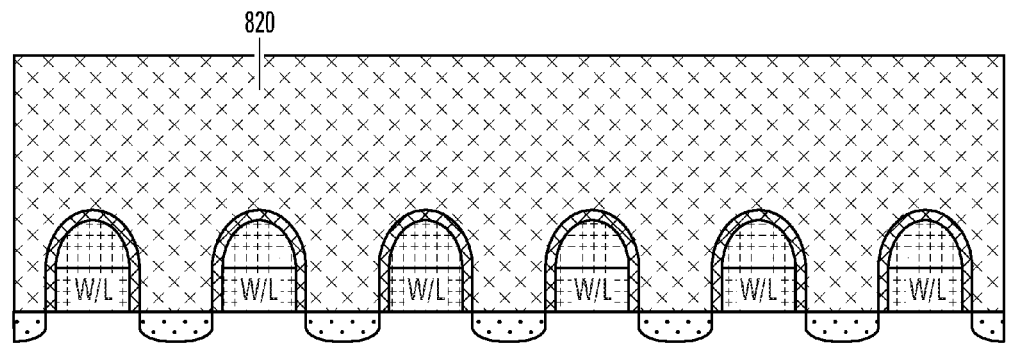
FIG. 5 illustrates a second stage of the front-end-of-line processes forming an implementation of a memory architecture described herein.
Figure 6:
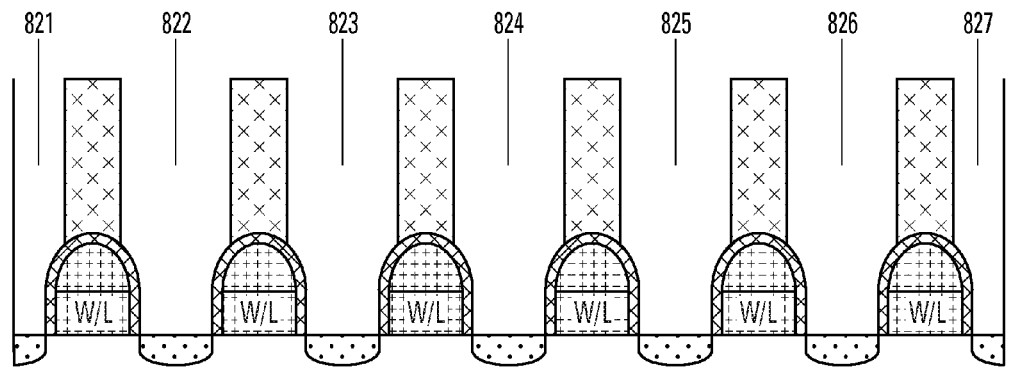
FIG. 6 illustrates a third stage of the front-end-of-line processes forming an implementation of a memory architecture described herein.

A next step in the illustrated embodiment of the self-aligned contact structure process is to form a fill layer 820 over the parallel conductive lines 801-806, as shown in FIG. 5. Next, as shown in FIG. 6, the fill layer 820 is etched using a lithographic process to define self-aligned trenches 822, 824, 826 in the positions for source lines and self-aligned vias 821, 823, 825, 827 in the position for the plugs. Any misalignment tolerances of the lithographic process are compensated for by relying on the parallel conductive lines as self-aligned etch masks as known in the art. Anisotropic etch processes are used that preferentially etch the dielectric fill, such as silicon dioxide, while stopping on an insulator such as silicon nitride that lines the conductive lines 801, 802, 803, 804, 805, and 806.

Figure 7:
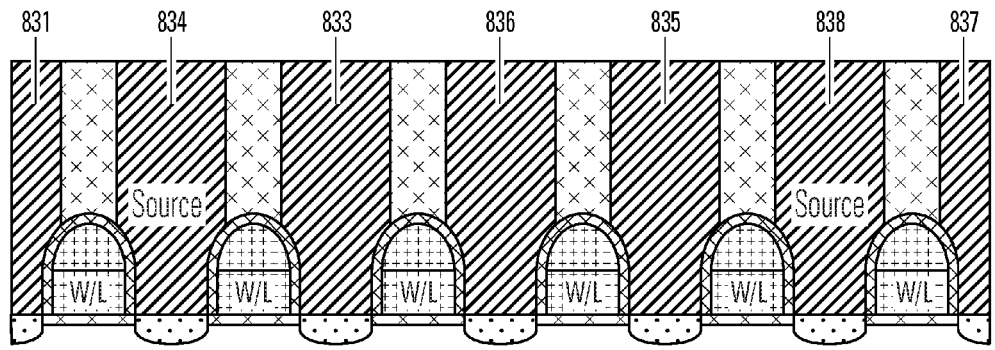
FIG. 7 illustrates a fourth stage of the front-end-of-line processes forming self-aligned contacts with an implementation of a memory architecture described herein.

Next as illustrated in FIG. 7, the self-aligned trenches and self-aligned vias in the dielectric fill layer 820 (See FIG. 5) are filled with a conductive material, such as a tungsten plug material with thin adhesion and diffusion barrier liners such as TiN (not shown), to define the plugs 831, 833, 835, 837 and source lines 834, 836, 838.

Figure 8:
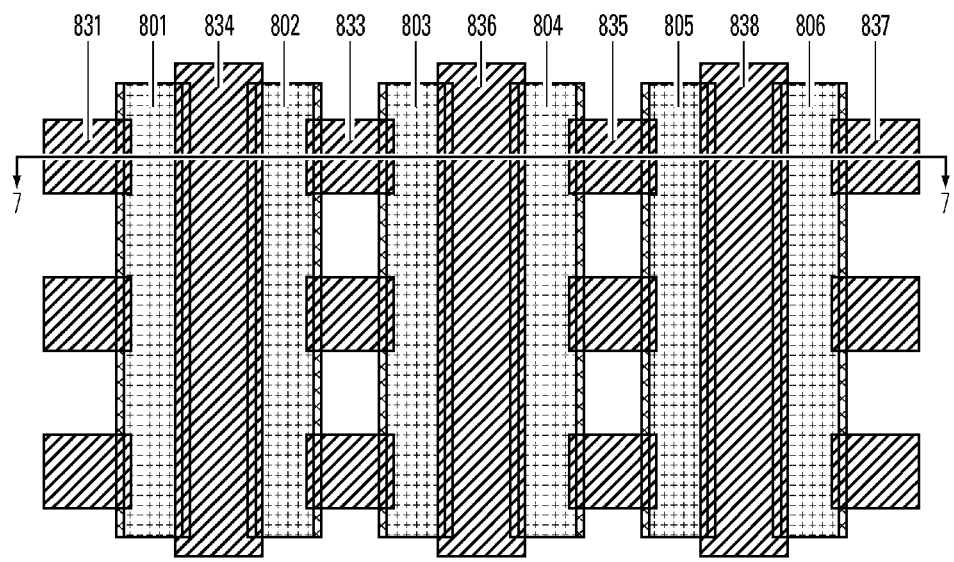
FIG. 8 illustrates in plan view a layout for the self-aligned contact structures shown in FIG. 7.

FIG. 8 shows the structure of the access transistor layer in plan view, where the cross-section shown in FIG. 7 is taken along the line 7-7. As shown, the conductive lines 801 to 806 (word lines) and the source lines 834, 836, 838 are arranged generally parallel along rows of cells in the array. Self-aligned contacts 831, 833, 835, and 837 are arranged in a line beneath bit lines, not shown, that are generally orthogonal to the conductive lines 801 to 806. The array is laid out in rows and columns as shown.

Figure 9:
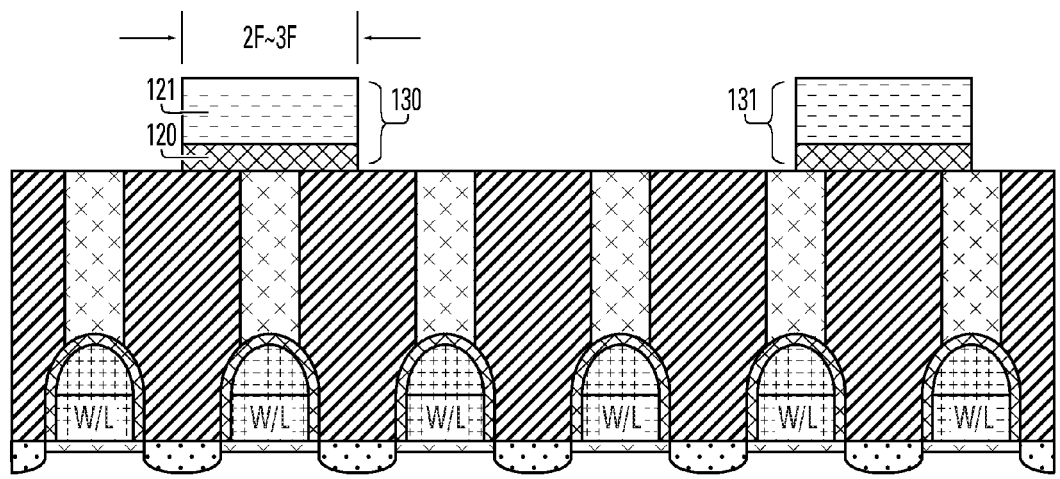
FIG. 9 illustrates a fifth stage of processes forming memory cells on the front-end-of-line structures described above for an implementation of a memory architecture described herein.

Next, as illustrated in FIG. 9, an electrode layer is formed beginning with forming patterned structures, or stacks, that comprise a layer of silicon nitride 120 with a layer of titanium nitride 121 on top to provide an electrode structure isolated from the source lines 834 and 838. FIG. 9 illustrates that the dimension of the electrode structure comprised of layers 120 and 121 is between about 2F and 3F, where F is the minimum lithographic feature size, allowing for small layout of the memory cell structure.

Figure 10:
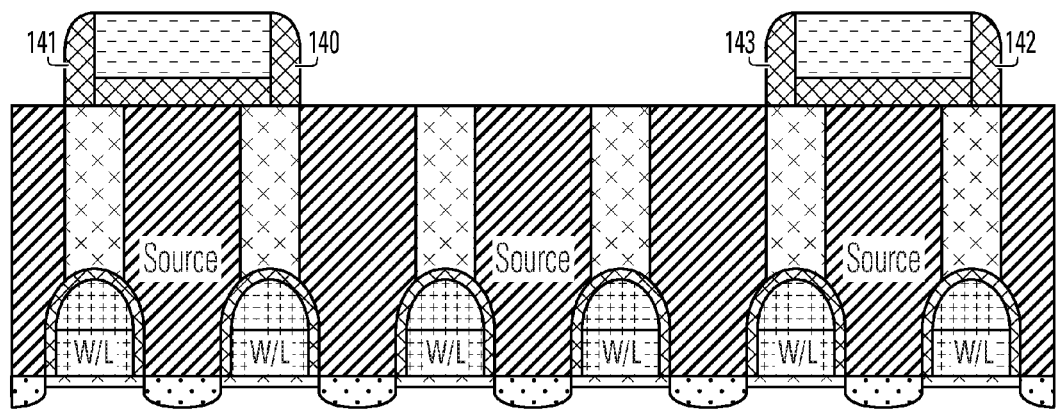
FIG. 10 is a cross-section showing further stages of processes forming memory cells for an implementation of a memory architecture described herein.

FIG. 10 illustrates a next stage in the process, in which dielectric sidewalls 140, 141, 142 and 143 are formed on the sides of the stacks 130, 131, (e.g. the stack including layer 120 and 121 in FIG. 9). Sidewalls 140-143 are made, for example, by forming a thin film dielectric layer that is conformal with the stacks and the sidewalls of the stacks, and then anisotropically etching the thin film dielectric to remove it from the regions between the stacks and on the surfaces of the stacks, while leaving the sidewalls 140-143. In embodiments of the process, the material used for formation of the sidewalls 140, 141, 142 and 143 comprises SiN or other dielectric material, such as silicon dioxide, silicon oxynitride, aluminum oxide, and the like.

Figure 11:
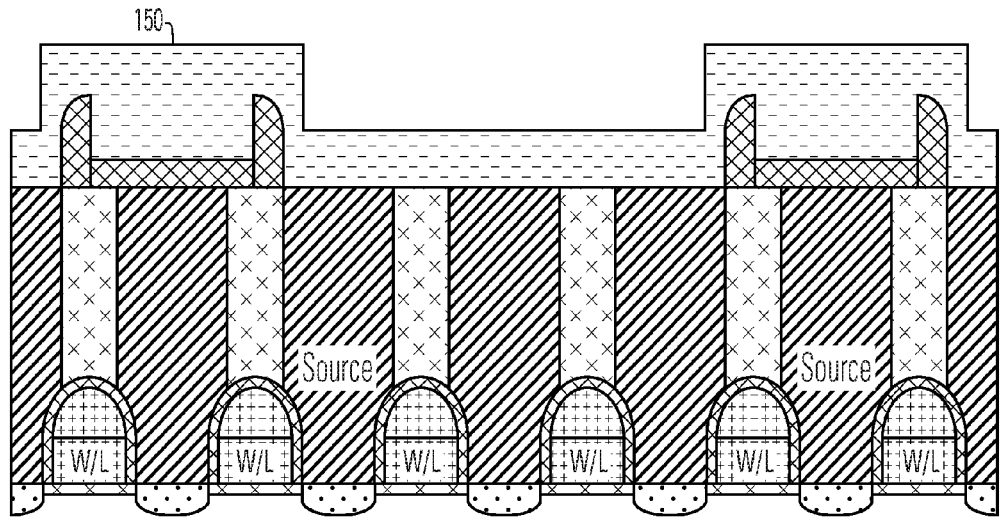
FIG. 11 shows a cross-sectional view corresponding to stages for formation of a layer of conductive material over the structure of FIG. 10.

FIG. 11 illustrates a next stage in the process, in which a second electrode material layer 150 is formed over the stacks 130, 131 and the sidewalls 140, 141, 142, 143. The electrode material layer 150 comprises TiN or other suitable conductive material, such as TaN, aluminum alloys, copper alloys, doped polysilicon, etc.

Figure 12:
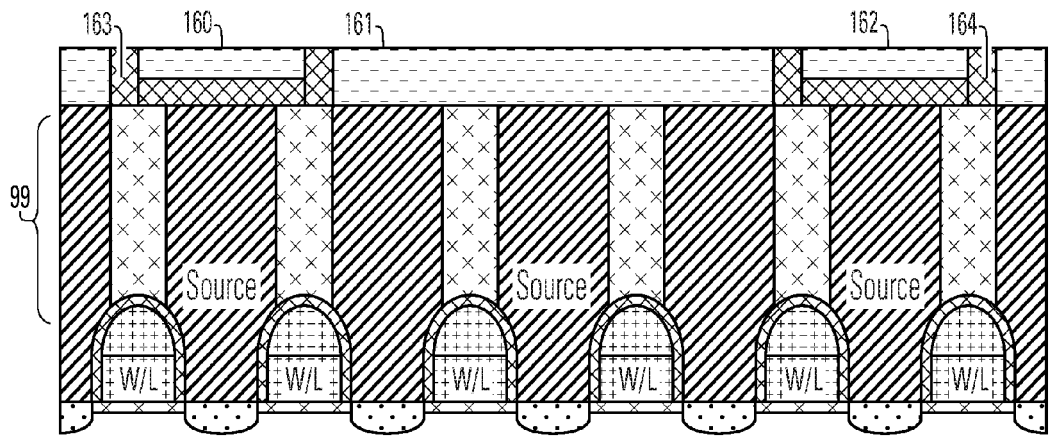
FIG. 12 shows a cross-sectional view corresponding to stages for polishing the conductive material and sidewall insulators in the structure of FIG. 11.

FIG. 12 illustrates a next stage in the process, in which the second electrode material layer 150, the sidewalls 140, 141, 142, 143 and the electrode material (121 in FIG. 9) are polished or otherwise planarized to define an electrode layer over the substrate provided by structure 99. Embodiments of the process for polishing include a chemical mechanical polishing process, followed by brush clean and liquid and or gas clean procedures, as known in the art. The electrode layer includes electrode members 160, 161, 162, and insulating members 163 and 164 in between them. The electrode layer in the illustrated embodiment has a substantially planar top surface. In the embodiment shown, the insulating members 163 and 164 comprise portions of a structure which also extends beneath electrode member 161, isolating them from the source lines 834 and 838. Source line 836 is isolated in later steps in this process flow. Other example structures may use different materials for the electrode members and insulating members.

Figure 13:
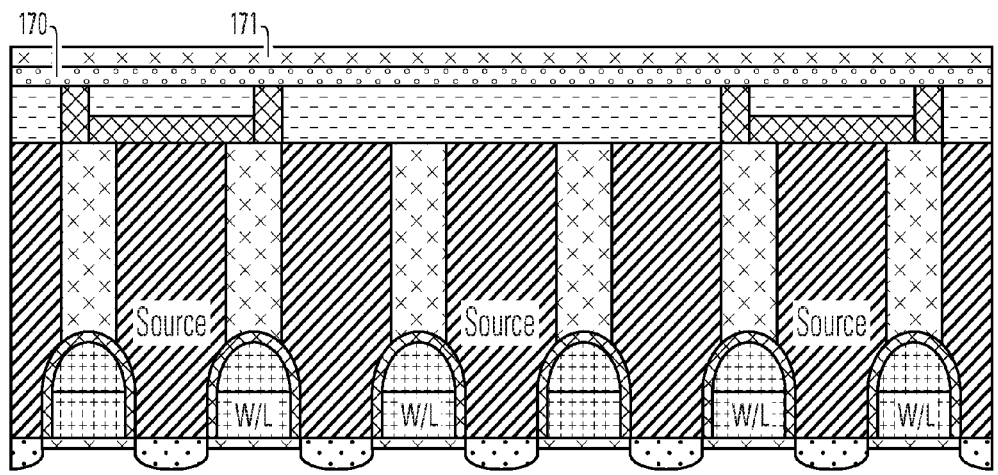
FIGS. 13 and 13A shows a cross-sectional view and a layout view corresponding to stages for forming strips of a thin film layer of phase change material and a protective cap layer on the structure of FIG. 12.

FIG. 13 illustrates a next stage in the process, in which a thin film layer 170 of a phase change based memory material is formed on the substantially planar top surface of the electrode layer. The memory material is deposited using sputtering without collimation at about 250 degrees C. This results in a thin film having a thickness of about 60 nanometers or less, when using $Ge_2Sb_2Te_5$ as the phase change memory material. Embodiments involve sputtering the entire wafer to thickness of about 40 nanometers on the flat surfaces. The thin film layer 170 has a thickness less than 100 nm in some embodiments, and more preferably 40 nm or less. In embodiments of the memory cell, the thin film layer 170 has a thickness of less than 20 nm, such as 10 nm. After forming the thin film layer 170, a protective cap layer 171 is formed. The protective cap layer 171 comprises a low-temperature deposited silicon dioxide or other dielectric material formed over the thin film layer 170. The protective cap layer 171 is preferably a good electrical insulator and a good thermal insulator, and protects the memory material from exposure in subsequent steps, such as photoresist stripping steps, which can damage the material. The process involves formation of a low-temperature dielectric, such as a silicon nitride layer or silicon oxide layer, using a process temperature less than about 200 degrees C. One suitable process is to apply silicon dioxide using plasma enhanced chemical vapor deposition PECVD.

Figure 13A:
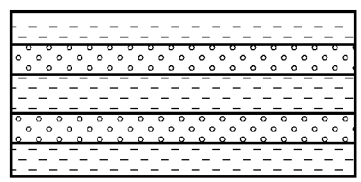

After formation of the protective cap layer 171, a dielectric fill over the memory material can be implemented using a higher temperature process such as high-density plasma chemical vapor deposition HDP CVD. Next, the resulting layers are etched in the pattern shown in FIG. 13A, to define narrow strips. For example, a photoresist layer is formed and patterned in a mask lithographic process or a sub-lithographic process to define narrow mask strips over the thin film layer 170 and protective cap layer 717. For example, the strips have a width equal to the minimum feature size F for the lithographic process used, where the minimum feature size for a process may be on the order of 0.2 microns (200 nm), 0.14 microns, or 0.09 microns in current mask lithographic processes. Obviously, embodiments of the process can be adapted to narrower minimum feature sizes as lithographic processes advance. Also, sub-lithographic processes may be employed, achieving line widths on the order of 40 nm or less.

Figure 14:
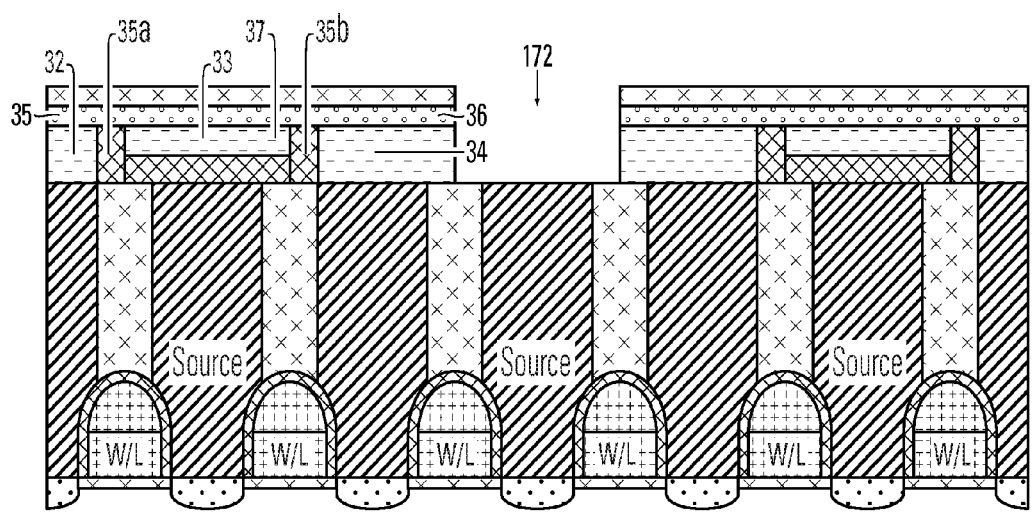
FIG. 14 shows a cross-sectional view for cell isolation patterning.

FIG. 14 illustrates a next stage in the process, in which the strips and electrodes are then patterned to form memory cell pairs comprising electrode members 32, 33 and 34, which are separated from one another by an insulating member including fences 35a and 35b formed for example by the sidewall process as described above, and base member. In addition, thin film bridge 35 of memory material, such as GST, overlies the electrode layer 31 on one side traversing across the fence member 35a, forming a first memory cell, and a bridge 36 (continuous with bridge 35 in this stage of the process) of memory material, such as GST, overlies the electrode layer 31 on another side traversing across the fence member 35b, forming a second memory cell.

Trenches 172 are etched around the electrode pairs, isolating them in both the row and column directions, and from the source line 186.

FIG. 15 illustrates a next stage in the process, in which a dielectric fill layer 230 with a planar top surface is formed over the electrode structures and fills the gaps and trenches 172 between them. In an embodiment of the process, the fill layer 230 is formed by HDP CVD, followed by chemical mechanical polishing and cleaning. The dielectric fill may comprise silicon oxides, silicon nitrides, and other insulating materials, preferably having good thermal as well as electrical insulating properties.

In some embodiments a structure for thermally insulating the bridges 35, 36 is provided, in addition to or instead of the dielectric fill layer 230. In one example, the thermally insulating structure is formed by providing a cap layer of thermally insulating material over the bridges and optionally over the electrode layer, before applying the dielectric fill. Representative materials for the layer of thermally insulating material include materials that are a combination of the elements silicon Si, carbon C, oxygen O, fluorine F, and hydrogen H. Examples of thermally insulating materials which are candidates for use for the thermally insulating cap layer include $SiO_2$, SiCOH, polyimide, polyamide, and fluorocarbon polymers. Other examples of materials which are candidates for use for the thermally insulating cap layer include fluorinated $SiO_2$, silsesquioxane, polyarylene ethers, parylene, fluoropolymers, fluorinated amorphous carbon, diamond like carbon, porous silica, mesoporous silica, porous silsesquioxane, porous polyimide, and porous polyarylene ethers. In other embodiments, the thermally insulating structure comprises a gas-filled void in the dielectric fill formed over the bridge 36 for thermal insulation. A single layer or combination of layers can provide thermal and electrical insulation.

In a next stage in the process, vias are etched in the fill layer 230 to the electrode material, through the memory material and the fill. The via etch process may be a single anisotropic etch for both the fill and the memory material, or a two step process first etching the fill material with a first etch chemistry, and second etching the memory material with a second etch chemistry. After forming the vias, the vias are filled with tungsten or other conductive material, to form plugs 63, 231 contacting the first electrode member (e.g. member 33) in the electrode structures, for electrical communication with circuitry above the electrode layer. In embodiments of the process, the vias are lined with a diffusion barrier layer and/or an adhesion layer, as known in the art, and filled with tungsten or other suitable conductive material. The structure is then planarized by chemical mechanical polishing and cleaned. Finally a "clean up" etch is applied and the resulting structure is cleaned.

FIG. 16 illustrates a next stage in the process, in which a patterned conductive layer (including bit line 40) is formed in contact with the plugs 63, 231 over the fill layer 230, providing bit lines and other conductors for the memory device, yielding a structure implementing the circuit of FIG. 1. In embodiments of the process, a copper alloy damascene metallization process is used in which the patterned conductive layer is formed depositing fluorosilicate glass (FSG) on the exposed surface, and then forming a photoresist pattern in the pattern desired. An etch is applied removing exposed FSG, and then liner and seed layers are deposited in the pattern. Then, copper plating is applied to fill the pattern. After plating, an anneal step is applied, followed by a polishing process. Other embodiments can use standard Al—Cu processes, or other metallization processes known in the art. The structure resulting is described in more detail above.

A cell described herein comprises a "top" electrode and a "bottom" electrode with a dielectric spacer in between, both contacting a bridge of phase change material over the electrodes spanning across the spacer. The electrodes and dielectric spacer are formed in an electrode layer over front-end-of-line CMOS logic structures or other function circuit structures, providing a structure that easily supports embedded memory and function circuits on a single chip, such as chips referred to as system-on-a-chip SOC devices.

Advantages of an embodiment described herein include that the phase change occurs in an active region near the center of the bridge over the dielectric spacer, rather than on the interface with an electrode, providing better reliability. Also, the current used in reset and programming is confined in a small volume allowing high current density and resultant local heating at lower reset current levels and lower reset power levels. The structure in embodiments described herein allows two dimensions of the cell to be defined by thin film thickness, achieving better process control at nanometer scales. Only one dimension of cell can be defined by a lithographic process using a trimmed mask layer, which avoids more complex shrinking techniques.

Other phase change memory cell structures, including pillar type structures in which the top electrode, memory element and bottom electrode are arranged in a pillar shaped stack, and mushroom type structures in which one of the electrodes is arranged to make contact with the memory element in a small area, and the other electrode contacts the memory element on the opposite side in a larger area, are also suitable for use with dual word line/source line access structures as described herein.

Figure 17:
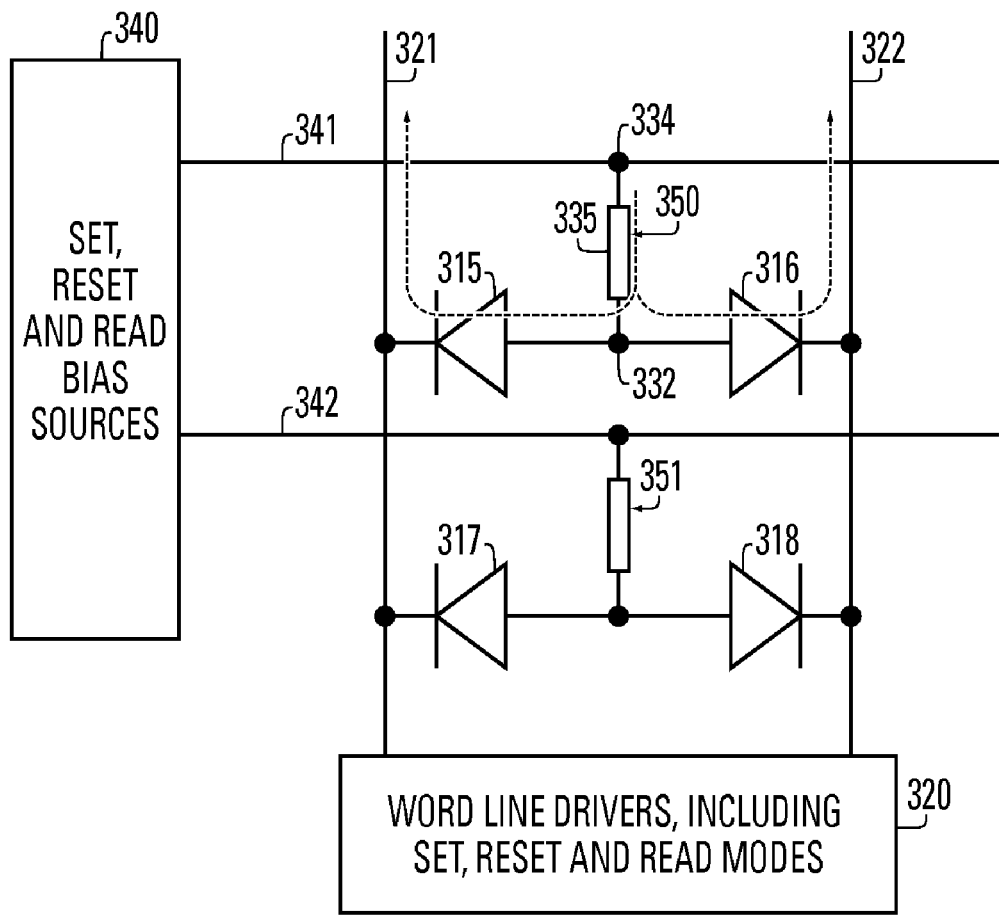
FIG. 17 is a schematic diagram for an alternative memory array comprising phase change memory cells with dual word lines which also act as source lines.

FIG. 17 illustrates an alternative implementation, in which the access devices comprise diodes. FIG. 17 shows a first memory cell 350, comprising a top electrode 334, a memory element 335 and a bottom electrode 332. A second memory cell 351 is also shown in the figure. A first word line conductor 321 and a second word line conductor 322 are coupled to word line drivers 320 which are operable in the set, reset and read modes as described above. A first bit line 341 and a second bit line 342 are coupled to biasing sources 340 for the set, reset and read modes, as well as sense amplifiers and data-in structures (not shown). A diode 315 and a diode 316 act as dual access devices for memory cell 350. The bottom electrode 332 of the memory cell 350 is coupled to the anode of the diode 315, and to the anode of the diode 316. The cathode of diode 315 is coupled to the word line conductor 321, and the cathode of the diode 316 is coupled to the word line conductor 322. In this embodiment, the word line conductors 321 and 322 act as both word lines and a source lines, in contrast to the embodiment of FIG. 1 which includes separate conductors as the source lines (28a, 28b, 28c) and the word lines (23a, 23b, 23c, 23d).

In operation, during the reset mode both word lines 321 and 322 are set to a low voltage such as ground, or other voltage sufficient cause the diodes 315, 316 to be conductive. The word lines 321 and 322 act as source lines in this mode, and current flows through the memory cell 350 along both word line conductors 321, 322 to establish a relatively low resistance path for the reset mode. During a read mode, only one of the word lines 321, 322 is set to a low voltage. During a set mode, only one of the word lines 321, 322 is set to a low voltage. As mentioned above, in some embodiments both of the word lines 321, 322 can be set to the low voltage during a set mode.

Figure 18:
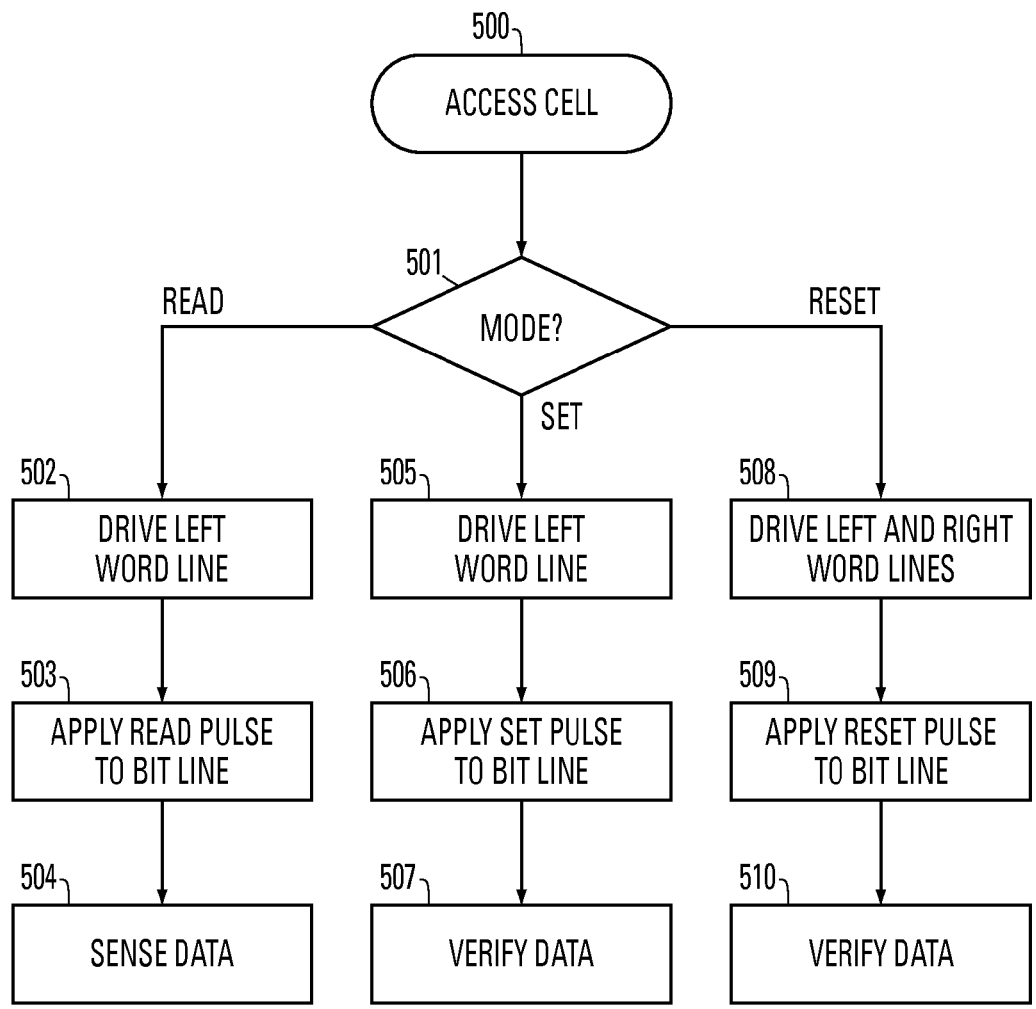
FIG. 18 is a flow chart for a method of operating memory devices as described herein.

FIG. 18 illustrates a basic method of operating a memory device such as that illustrated in FIG. 2 having dual word line/source line structures. The process illustrated in FIG. 18 is executed under control of the state machine 69 of FIG. 3, for the illustrated embodiment. The process is executed upon a command to access a selected memory cell (500). Upon receiving the command, the process determines the mode of access (501). If the mode of access is the read mode, then the control logic enables the word line drivers to drive to the left word line with the voltage sufficient to enable current flow through the left access device and the selected memory cell, while leaving the right word line with a voltage sufficient to prevent current flow through the right access device (502). Next a read bias pulse is applied to the bit line corresponding with the selected memory cell (503). Finally, the data of the selected memory cell is sensed (504).

If the mode of access is the set mode, then the operation is similar. The control logic enables the word line drivers to drive to the left word line with the voltage sufficient to enable current flow through the left access device and the selected memory cell, while leaving the right word line with a voltage sufficient to prevent current flow through the right access device (505). Next, a set bias pulse is applied to the bit line corresponding with the selected memory cell (506). Finally, the data of the selected memory cell is verified (507).

If the mode of access is the reset mode, then the control logic enables the word line drivers to drive both the left word line and the right word line with a voltage sufficient to enable current flow through the left and right access devices in parallel (508). Next, a reset pulse is applied to the bit line (509). Finally, the data of the selected memory cell is verified (510).

As mentioned above, in an alternative embodiment, during the set mode, or during one or more of the set modes for multilevel cells, the control logic can enable driving both word lines in the manner described for the reset mode.

While the present invention is disclosed by reference to the preferred embodiments and examples detailed above, it is to be understood that these examples are intended in an illustrative rather than in a limiting sense. It is contemplated that modifications and combinations will occur to those skilled in the art, which modifications and combinations will be within the spirit of the invention and the scope of the following claims.

What is claimed is:

1. A memory device, comprising:
   first and second access devices and a memory element sharing a common current flow terminal, the first and the second access devices and the memory element each having an additional current flow terminal;
   a bit line electrically coupled to the additional current flow terminal of the memory element;
   a first conductive line electrically coupled to the additional current flow terminal of the first access device;
   a second conductive line electrically coupled to the additional current flow terminal of the second access device;
   a control circuit causing a first current path through the bit line, the memory element, and both the first access device and the second access device for a reset operation; and
   the control circuit causing a second current path through the bit line, the memory element, and either: (i) for both a set operation and a read operation, the first access device but not the second access device, or (ii) for both the set operation and the read operation, the second access device but not the first access device.

2. The memory device of claim 1, wherein the first and second access devices are transistors.

3. The memory device of claim 1, wherein the first and second access devices are diodes.

4. The memory device of claim 1, wherein the memory element is a phase change element.

5. The memory device of claim 1, wherein the memory element is a phase change element with an active region having a crystalline phase and an amorphous phase.

6. The memory device of claim 1, wherein the memory element is a phase change element with an active region having at least two solid phases.

7. The memory device of claim 1, wherein the memory element is a phase change element with an active region having a crystalline phase following the set operation and an amorphous phase following the reset operation.

8. The memory device of claim 1, further comprising:
   an insulating member positioned between the bit line and the common current flow terminal, wherein the memory element extends from the bit line to the common current flow terminal across the insulating member.

9. A memory device, comprising:
   a first access device having two current flow terminals, including a first terminal and a second terminal;
   a second access device having two current flow terminals, including the second terminal and a third terminal;
   a memory element having two current flow terminals, including the second terminal and a fourth terminal;
   a bit line electrically coupled to the fourth terminal;
   a control circuit causing, for a reset operation, a first current through the bit line, the memory element, and both (i) the first access device and the first terminal and (ii) the second access device and the third terminal; and
   the control circuit causing a second current through the bit line, the memory element, and either: (i) for both a set operation and a read operation, the first access device and the first terminal, but not the second access device and the third terminal, or (ii) for both the set operation and the read operation, the second access device and the third terminal, but not the first access device and the first terminal.

10. The memory device of claim 9, wherein the first and second access devices are transistors.

11. The memory device of claim 9, wherein the first and second access devices are diodes.

12. The memory device of claim 9, wherein the memory element is a phase change element.

13. The memory device of claim 9, wherein the memory element is a phase change element with an active region having a crystalline phase and an amorphous phase.

14. The memory device of claim 9, wherein the memory element is a phase change element with an active region having at least two solid phases.

15. The memory device of claim 9, wherein the memory element is a phase change element with an active region having a crystalline phase following the set operation and an amorphous phase following the reset operation.

16. The memory device of claim 9, further comprising:
   an insulating member positioned between the bit line and the second terminal, wherein the memory element extends from the bit line to the second terminal across the insulating member.

17. A memory circuit, comprising:
   first and second adjacent memory devices, each including:
      first and second access devices and a memory element sharing a common current flow terminal, the first and the second access devices and the memory element each having an additional current flow terminal;
   a bit line;
   a shared conductive plug electrically coupling the via to the additional current flow terminal of the memory element of both the first and the second adjacent memory devices;
   a plurality of conductive lines electrically coupled to the additional current flow terminals of the first and the second access devices of the first and the second adjacent memory devices;
   a control circuit causing, for a reset operation of at least one of the first and the second adjacent memory devices, a first current path through the bit line, the memory element, and both the first and the second access device; and
   the control circuit causing, for at least one of a set operation and a read operation, a second current path through the bit line, the memory element, and at least one of the first and the second access devices.

18. The memory device of claim 17, wherein the additional current flow terminal of the first access device of the first adjacent memory device is shared with the additional current flow terminal of the first access devices of the second adjacent memory device.

19. The memory device of claim 17, wherein the plurality of conductive lines include separate conductive lines for the additional current flow terminals of the first access device and the second access device of the first adjacent memory device.

* * * * *